US011322523B2

(12) United States Patent
Ina et al.

(10) Patent No.: US 11,322,523 B2
(45) Date of Patent: May 3, 2022

(54) ACTIVE MATRIX SUBSTRATE, DISPLAY DEVICE, AND METHOD OF MANUFACTURING ACTIVE MATRIX SUBSTRATE

(71) Applicant: SHARP KABUSHIKI KAISHA, Sakai (JP)

(72) Inventors: Keiichi Ina, Sakai (JP); Yasuyoshi Kaise, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 132 days.

(21) Appl. No.: 16/627,097

(22) PCT Filed: Jun. 28, 2018

(86) PCT No.: PCT/JP2018/024628
§ 371 (c)(1),
(2) Date: Dec. 27, 2019

(87) PCT Pub. No.: WO2019/009184
PCT Pub. Date: Jan. 10, 2019

(65) Prior Publication Data
US 2020/0168633 A1 May 28, 2020

(30) Foreign Application Priority Data
Jul. 5, 2017 (JP) .............................. JP2017-132280

(51) Int. Cl.
*G02F 1/13* (2006.01)
*H01L 27/12* (2006.01)
(Continued)

(52) U.S. Cl.
CPC .......... *H01L 27/124* (2013.01); *G02F 1/1368* (2013.01); *G02F 1/136286* (2013.01); *G04G 17/02* (2013.01); *H01L 27/1259* (2013.01); *H01L 29/404* (2013.01); *G02F 1/136218* (2021.01); *G02F 2201/121* (2013.01);
(Continued)

(58) Field of Classification Search
CPC ....................................................... G02F 1/13
See application file for complete search history.

(56) References Cited

U.S. PATENT DOCUMENTS 5,610,736 A 3/1997 Asai
2008/0117497 A1* 5/2008 Shimodaira ....... G02F 1/136286
359/296

(Continued)

FOREIGN PATENT DOCUMENTS

CN 103137616 A 6/2013
JP H07-230104 A 8/1995
(Continued)

*Primary Examiner* — Sang V Nguyen
(74) *Attorney, Agent, or Firm* — ScienBiziP, P.C.

(57) ABSTRACT

To reduce a reduction in the quality of a displayed image in portions corresponding to source lines including detour portions in a display area. Gate lines (20) and source lines (30), which intersect with each other, extend on an insulating substrate (1) so as to detour an opening area (A1). Separated portions (24) are provided as lower shielding electrodes (23) in an inner non-display area (A2) so as to be overlapped with source detour portions (31) of the source lines (30) in a plan view.

13 Claims, 13 Drawing Sheets

(51) Int. Cl.
*G02F 1/1362* (2006.01)
*G02F 1/1368* (2006.01)
*G04G 17/02* (2006.01)
*H01L 29/40* (2006.01)
*G04B 19/04* (2006.01)

(52) U.S. Cl.
CPC .... *G02F 2201/123* (2013.01); *G02F 2201/56* (2013.01); *G04B 19/04* (2013.01)

(56) References Cited

U.S. PATENT DOCUMENTS

| | | |
|---|---|---|
| 2008/0225216 A1 | 9/2008 | Shimodaira |
| 2013/0314636 A1* | 11/2013 | Chen ............... G02F 1/1343 349/43 |
| 2014/0197428 A1 | 7/2014 | Wang et al. |
| 2016/0209719 A1* | 7/2016 | Yamaguchi ......... G02F 1/1368 |

FOREIGN PATENT DOCUMENTS

| | | | |
|---|---|---|---|
| JP | 2008-257191 A | 10/2008 | |
| JP | 2010-054980 A | 3/2010 | |
| JP | 2010-197740 A | 9/2010 | |
| JP | 2010197740 * | 9/2010 | ............... G02F 1/13 |
| JP | 5219884 B2 | 6/2013 | |
| JP | 2014-134766 A | 7/2014 | |

* cited by examiner

ACTIVE MATRIX SUBSTRATE, DISPLAY DEVICE, AND METHOD OF MANUFACTURING ACTIVE MATRIX SUBSTRATE

TECHNICAL FIELD

The present invention relates to an active matrix substrate, a display device, and a method of manufacturing the active matrix substrate. In particular, the present invention relates to an active matrix substrate in which part of source lines includes detour portions, a display device, and a method of manufacturing the active matrix substrate.

BACKGROUND ART

Combining active matrix display devices having openings with another devices is in widespread use in recent years. The display device is, for example, used on the surface of an analog wristwatch, as disclosed in PTL 1, or used on the surface on which part of reels of a slot machine is exposed, as disclosed in PTL 2.

However, when the opening is provided in the active matrix display device, it is necessary to extend gate lines and source lines so as to go around the opening.

Detour portions of scanning signal lines and source lines are capable of being provided in a display area. However, when the detour portions are provided in the display area, the display quality may be reduced due to parasitic capacitance between the detour portions and pixel electrodes, as disclosed in PTL 3. Such parasitic capacitance between the pixel electrodes and other lines or electrodes is critical in keeping and improving the display quality. For example, PTL 4 discloses a configuration in which a shielding electrode extends from the gate lines so as to be overlapped with the source lines in order to reduce the parasitic capacitance between the pixel electrodes and the source lines. Accordingly, the detour portions normally extend in a non-display area around the opening.

In order to reduce the size of the non-display area around the opening while keeping the display quality, for example, PTL 1 discloses a configuration in which multiple low-voltage power lines and multiple high-voltage power lines are integrated around the opening to save the wiring space of the detour portions of the low-voltage power lines and the high-voltage power lines. In addition, for example, PTL 3 discloses a configuration in which the detour portions are covered with an organic insulating film to use a portion between a sealing material and the opening as the wiring space of the detour portions.

CITATION LIST

Patent Literature

PTL 1: Japanese Unexamined Patent Application Publication No. 2008-257191 (Published on Oct. 23, 2018)
PTL 2: Japanese Unexamined Patent Application Publication No. 2014-134766 (Published on Jul. 24, 2014)
PTL 3: Japanese Unexamined Patent Application Publication No. 2010-54980 (Published on Mar. 11, 2010)
PTL 4: Japanese Unexamined Patent Application Publication No. 7-230104 (Published on Aug. 29, 1995)

SUMMARY OF INVENTION

Technical Problem

However, the technologies in related art described above have a problem in that the display quality is reduced in portions corresponding to the source lines including the detour portions in the display area. This is because, since the adjacent interval between the detour portions is made small in order to reduce the size of the non-display area around the opening, the parasitic capacitance between the detour portions that are adjacent to each other is increased.

One aspect of the present invention is provided to resolve the above problem. It is an object of the present invention to realize an active matrix substrate, a display device, and a method of manufacturing the active matrix substrate, which are capable of reducing a reduction in the display quality in the portions corresponding to the source lines including the detour portions in the display area.

Solution to Problem

In order to resolve the above problem, an active matrix substrate according to one aspect of the present invention includes a substrate on which an opening area, an inner non-display area at an outer side of the opening area, and a display area at the outer side of the inner non-display area are set; multiple gate lines and multiple source lines intersecting with the gate lines, which extend on the substrate so as to detour the opening area; and multiple pixel electrodes provided in the display area on the substrate so as to correspond to intersections between the gate lines and the source lines only the display area. Part of the source lines includes source detour portions passing through the inner non-display area. The active matrix substrate further includes shielding electrodes provided in the inner non-display area on the substrate so as to be overlapped with part or all of the source detour portions in a plan view.

In order to resolve the above problem, a method of manufacturing the active matrix substrate according to one aspect of the present invention includes a first step of setting an opening area, an inner non-display area at an outer side of the opening area, and a display area at the outer side of the inner non-display area on a substrate; a second step of extending multiple gate lines on the substrate so as to detour the opening area; a third step of extending multiple source lines intersecting with the gate lines on the substrate so as to detour the opening area; and a fourth step of providing multiple pixel electrodes in the display area on the substrate so as to correspond to intersections between the gate lines and the source lines only in the display area. Part of the source lines includes source detour portions passing through the inner non-display area. The method further includes a fifth step of providing shielding electrodes in the inner non-display area on the substrate so as to be overlapped with part or all of the source detour portions in a plan view.

Advantageous Effects of Invention

An embodiment of the present invention produces the effect of improving the display quality in portions corresponding to the source lines including the source detour portions in the display area.

DESCRIPTION OF EMBODIMENTS

First Embodiment

An embodiment of the present invention will herein be described in detail.
(Wristwatch)

Figure 1:
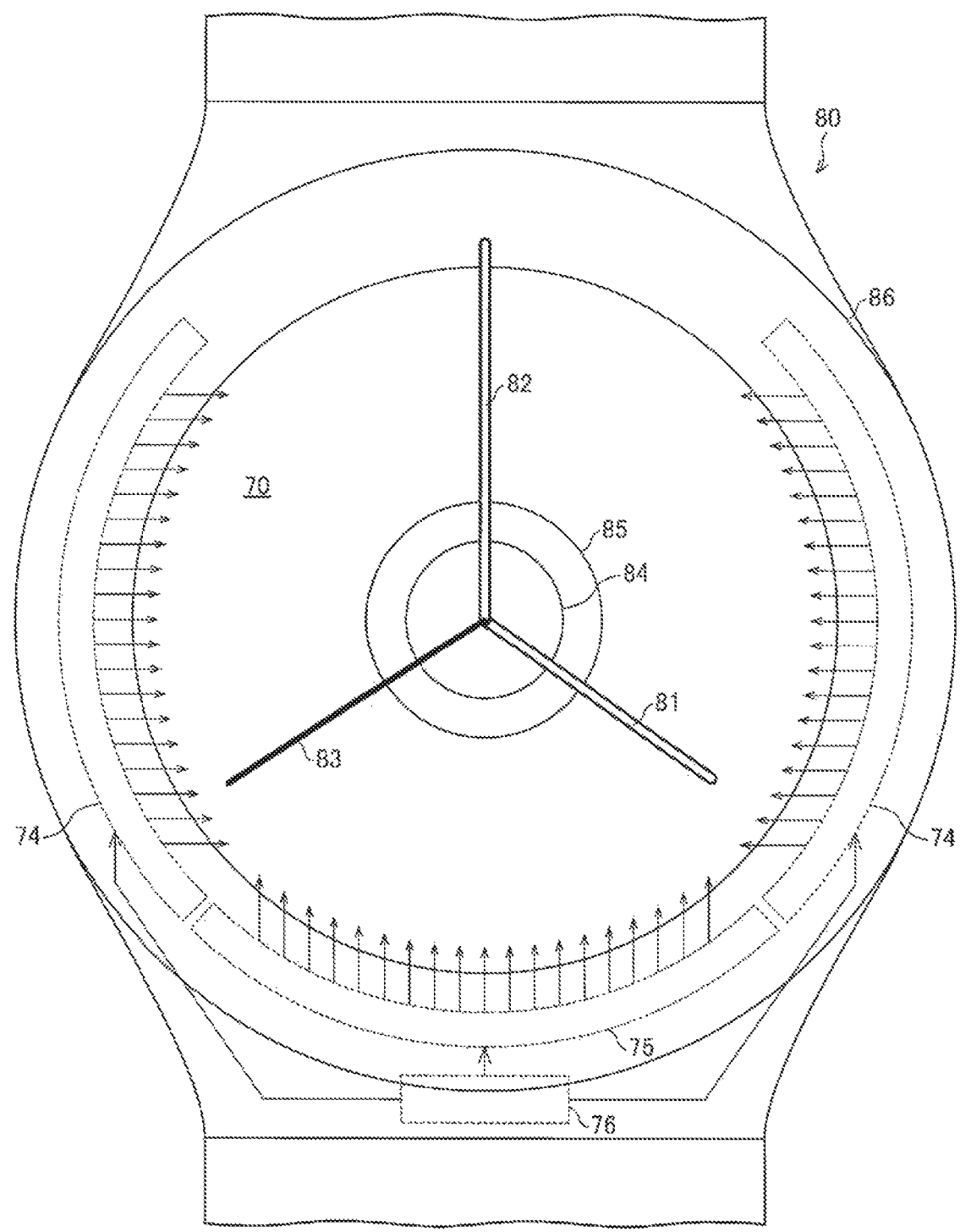
FIG. 1 is a plan view illustrating a schematic configuration of a wristwatch including a liquid crystal display panel according to some embodiments of the present invention.

FIG. 1 is a plan view illustrating a schematic configuration of a wristwatch 80 including a liquid crystal display panel 70 (a display device) according to a first embodiment of the present invention.

As illustrated in FIG. 1, the wristwatch 80 is an analog watch that indicates time by an hour hand 81, a minute hand 82, and a second hand 83 that rotate around a drive shaft 84. The wristwatch 80 uses the liquid crystal display panel 70 on its surface. The drive shaft 84 passes through an opening 64 (refer to FIG. 2) of the liquid crystal display panel 70 and is coupled to a mechanical driving mechanism built in the rear of the liquid crystal display panel 70. In addition, the liquid crystal display panel 70 is connected to a gate driver 74, a source driver 75, and a control circuit 76 that are built in the wristwatch 80. The inner periphery of the opening 64 of the liquid crystal display panel 70 is covered with an inner rim 85 of the wristwatch 80 and the outer periphery of the liquid crystal display panel 70 is covered with an outer cover 86 of the wristwatch 80.

The mechanical driving mechanism, which rotates the hour hand 81, the minute hand 82, and the second hand 83, may have any known configuration and a detailed description of the configuration of the mechanical driving mechanism is omitted herein. The liquid crystal display panel 70 may be used for watches and clocks (for example, a clock and a wall clock) other than the wristwatch 80 and may be used for applications other than the watch and clock.

The gate driver 74 is a drive circuit that drives gate lines 20 (refer to FIG. 4) extending on an active matrix substrate 60. The source driver 75 is a drive circuit that drives source lines 30 (refer to FIG. 4) extending on the active matrix substrate 60. The control circuit 76 is a circuit that controls the gate driver 74 and the source driver 75.
(Display Panel)

Figure 2:
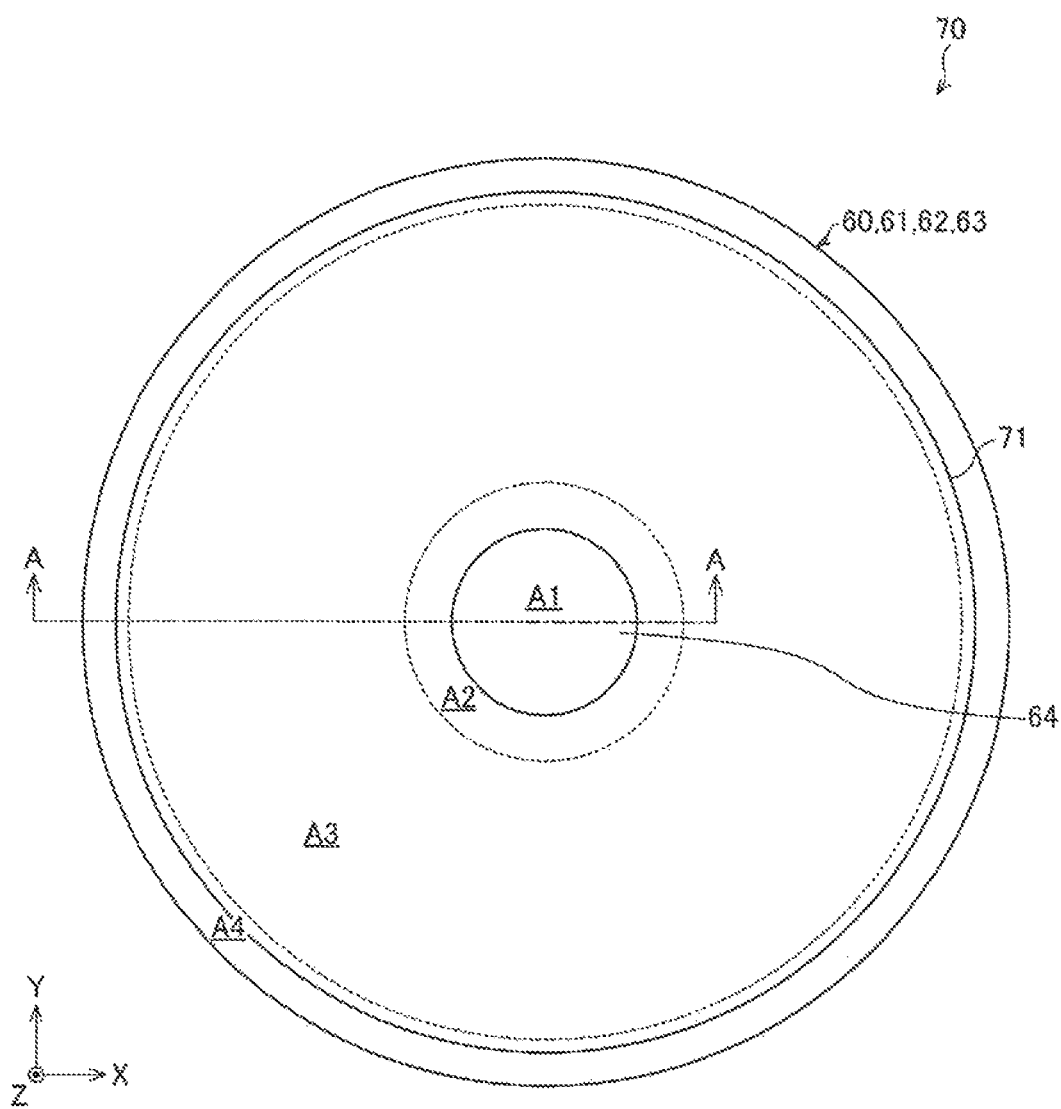
FIG. 2 is a plan view illustrating a schematic configuration of the liquid crystal display panel according to some embodiments of the present invention.

FIG. 2 is a plan view illustrating a schematic configuration of the liquid crystal display panel 70 illustrated in FIG. 1.

Figure 3:
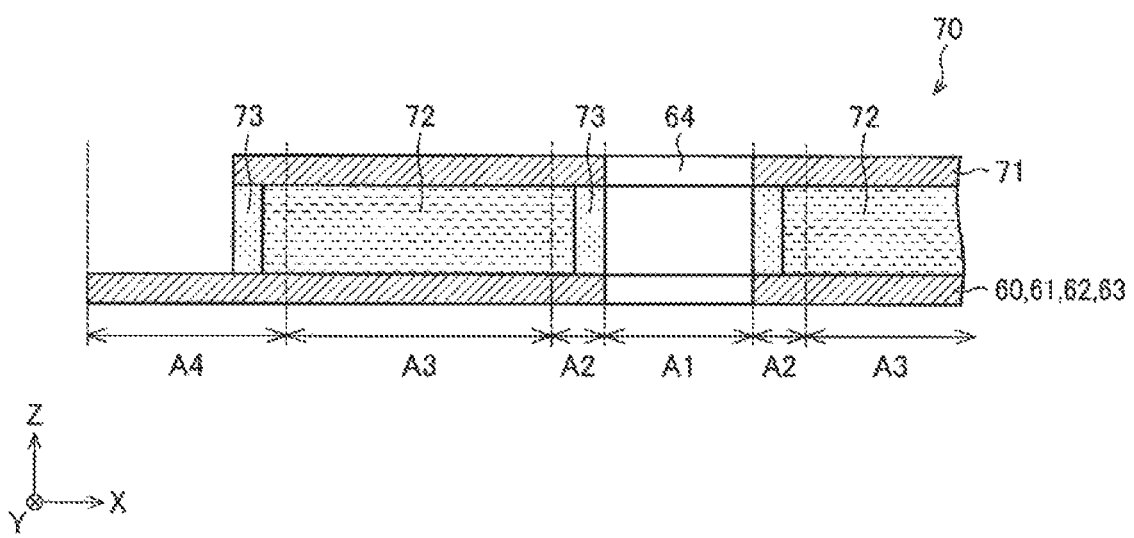
FIG. 3 is a cross-sectional view illustrating a schematic configuration of the liquid crystal display panel according to some embodiments of the present invention and is a cross-sectional view taken along the AA line in FIG. 2.

FIG. 3 is a cross-sectional view illustrating a schematic configuration of the liquid crystal display panel 70 illustrated in FIG. 1. FIG. 3 is a cross-sectional view taken along the AA line in FIG. 2.

As illustrated in FIG. 2 and FIG. 3, the liquid crystal display panel 70 includes an opposing substrate 71, a liquid crystal layer 72, a sealing material 73, and the active matrix substrate 60 according to the first embodiment of the present invention. In addition, an opening area A1 having the opening 64 provided therein, an inner non-display area A2 around the opening 64, a display area A3, and an outer non-display area A4 along the outer periphery are provided on the liquid crystal display panel 70.

The liquid crystal display panel 70 in the present embodiment adopts a fringe field switching (FFS) mode as a so-called liquid crystal mode. The liquid crystal display panel 70 does not limitedly adopt this mode and may adopt a liquid crystal mode other than the FFS mode. The liquid crystal mode is a mode in which the arrangement of liquid crystal molecules included in the liquid crystal layer 72 is varied. The arrangement of the liquid crystal molecules is varied with the electric field between a common electrode 52 and pixel electrodes 50. Accordingly, a vertical orientation mode in which a vertical electric field in a direction vertical to the substrate face (in the z-axis direction) is applied and a horizontal orientation mode in which a horizontal electric field in a direction horizontal to the substrate face (in the xy plane direction) is applied are known as the main liquid crystal modes. In addition, the FFS mode in which an oblique electric field including the components of both the horizontal electric field and the vertical electric field, that is, a fringe electric field is applied is used as an in-plane switching (IPS) mode, which is one kind of the horizontal orientation mode.

A black matrix and color filters (both of them are not illustrated) are formed on a face of the opposing substrate 71 at a side opposed to the active matrix substrate 60 and deflector plates are provided on the opposite face. The common electrode 52 may be formed on the opposing substrate 71 depending on the liquid crystal mode adopted by the liquid crystal display panel 70.

The liquid crystal layer 72 is sealed with the sealing material 73 between the opposing substrate 71 and the active matrix substrate 60.

The sealing material 73 is formed in the inner non-display area A2 and the outer non-display area A4. Although the sealing material 73 formed in the inner non-display area A2 is formed so as to coincide with the inner periphery of the opening 64 in FIG. 3, the sealing material 73 formed in the inner non-display area A2 may be formed so as to be apart from the inner periphery of the opening 64. Although the sealing material 73 formed in the outer non-display area A4 is also formed so as to coincide with the outer periphery of the opposing substrate 71 in FIG. 3, the sealing material 73 formed in the outer non-display area A4 may be formed so as to be apart from the outer periphery of the opposing substrate 71.

Although the opposing substrate 71 and the active matrix substrate 60 have circular shapes in FIG. 2, the shapes of the opposing substrate 71 and the active matrix substrate 60 are not limited to those. For example, multiple openings 64 may be provided. For example, the opening 64 may have another shape, such as a polygon or an oval. For example, the outer peripheries of the opposing substrate 71 and the active matrix substrate 60 may have other shapes, such as polygons or ovals, and the shapes of the outer peripheries of the opposing substrate 71 and the active matrix substrate 60 may be different from the shape of the opening 64.

(Active Matrix Substrate)

Figure 4:
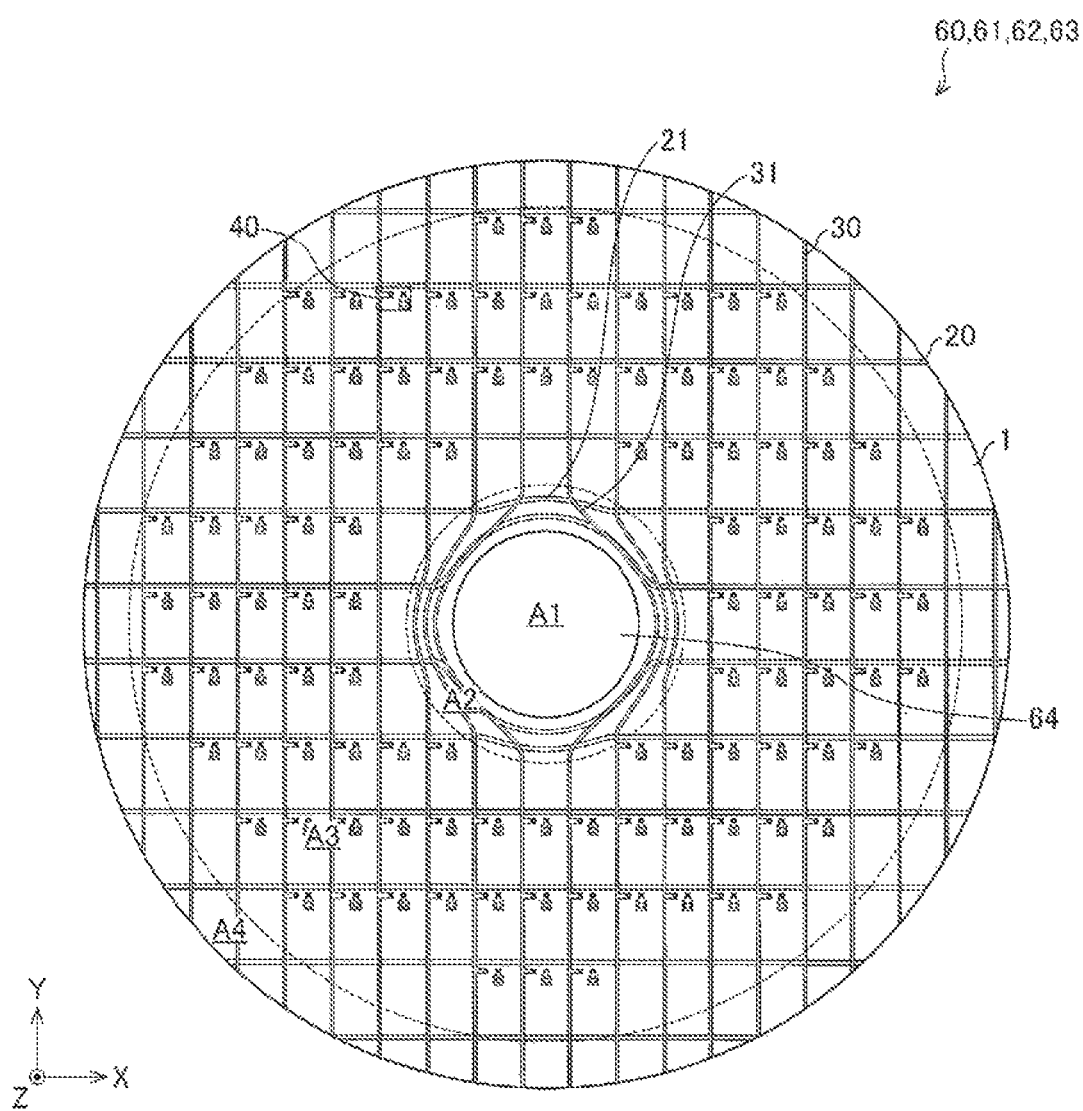
FIG. 4 is a plan view illustrating a schematic configuration of active matrix substrates according to some embodiments of the present invention.

FIG. 4 is a plan view illustrating a schematic configuration of the active matrix substrate 60 illustrated in FIG. 2 and FIG. 3. The pixel electrodes 50 and the common electrode 52 are omitted in FIG. 4 for convenience of illustration.

Figure 5:
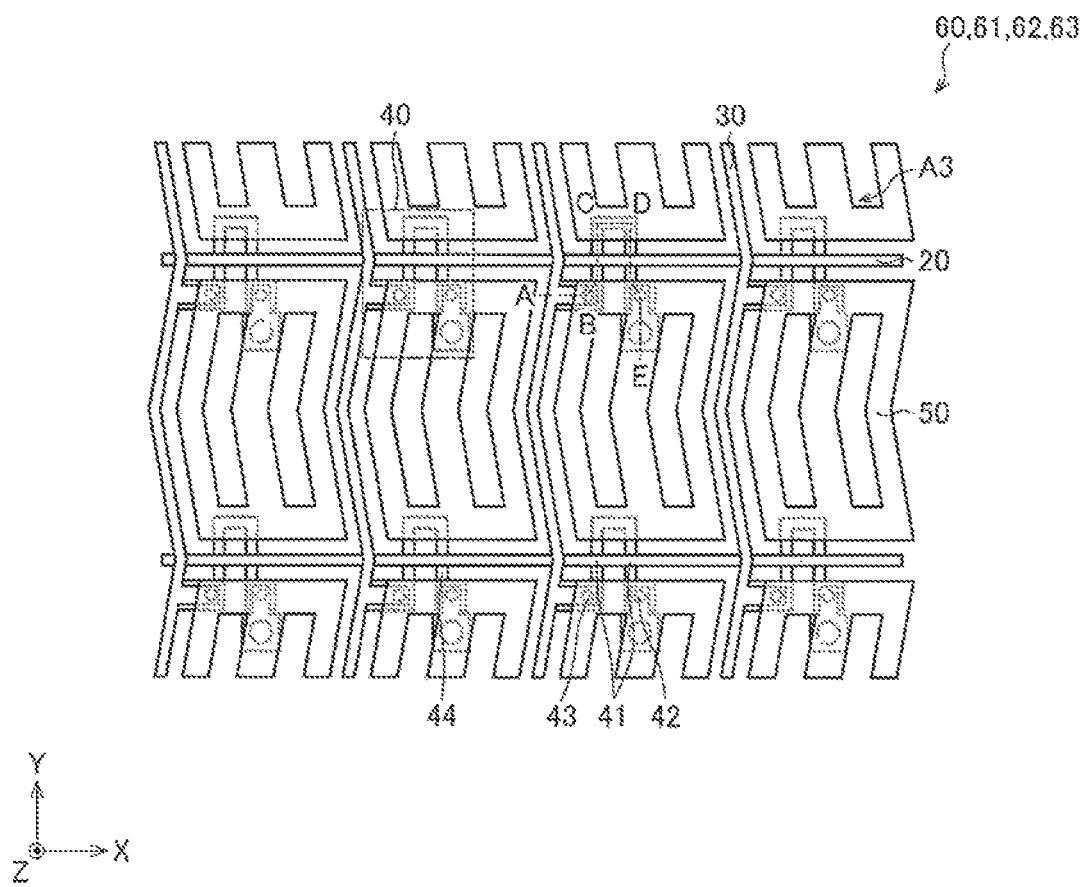
FIG. 5 is a plan view illustrating a schematic configuration of a display area of the active matrix substrates according to some embodiments of the present invention.

FIG. 5 is a plan view illustrating a schematic configuration of the display area A3 of the active matrix substrate 60 illustrated in FIG. 4. The common electrode 52 is omitted in FIG. 5 for convenience of illustration.

Figure 6:
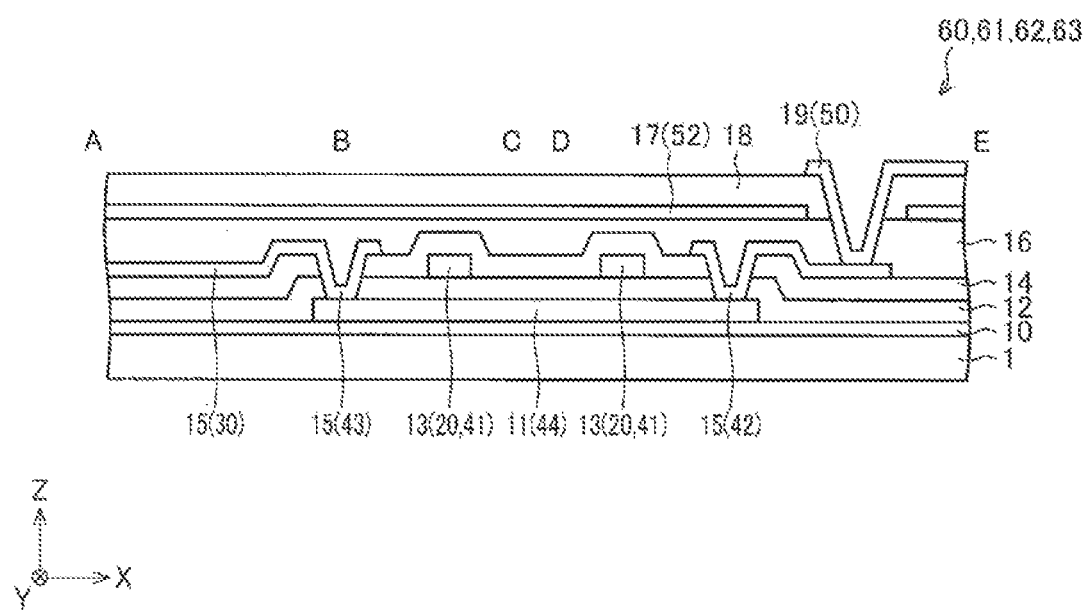
FIG. 6 is a cross-sectional view illustrating a schematic configuration of the display area of the active matrix substrates according to some embodiments of the present invention and is a cross-sectional view taken along the ABCDE line in FIG. 5.

FIG. 6 is a cross-sectional view illustrating a schematic configuration of the display area A3 of the active matrix substrate 60 illustrated in FIG. 4. FIG. 6 is a cross-sectional view taken along the ABCDE line in FIG. 5.

Figure 7:
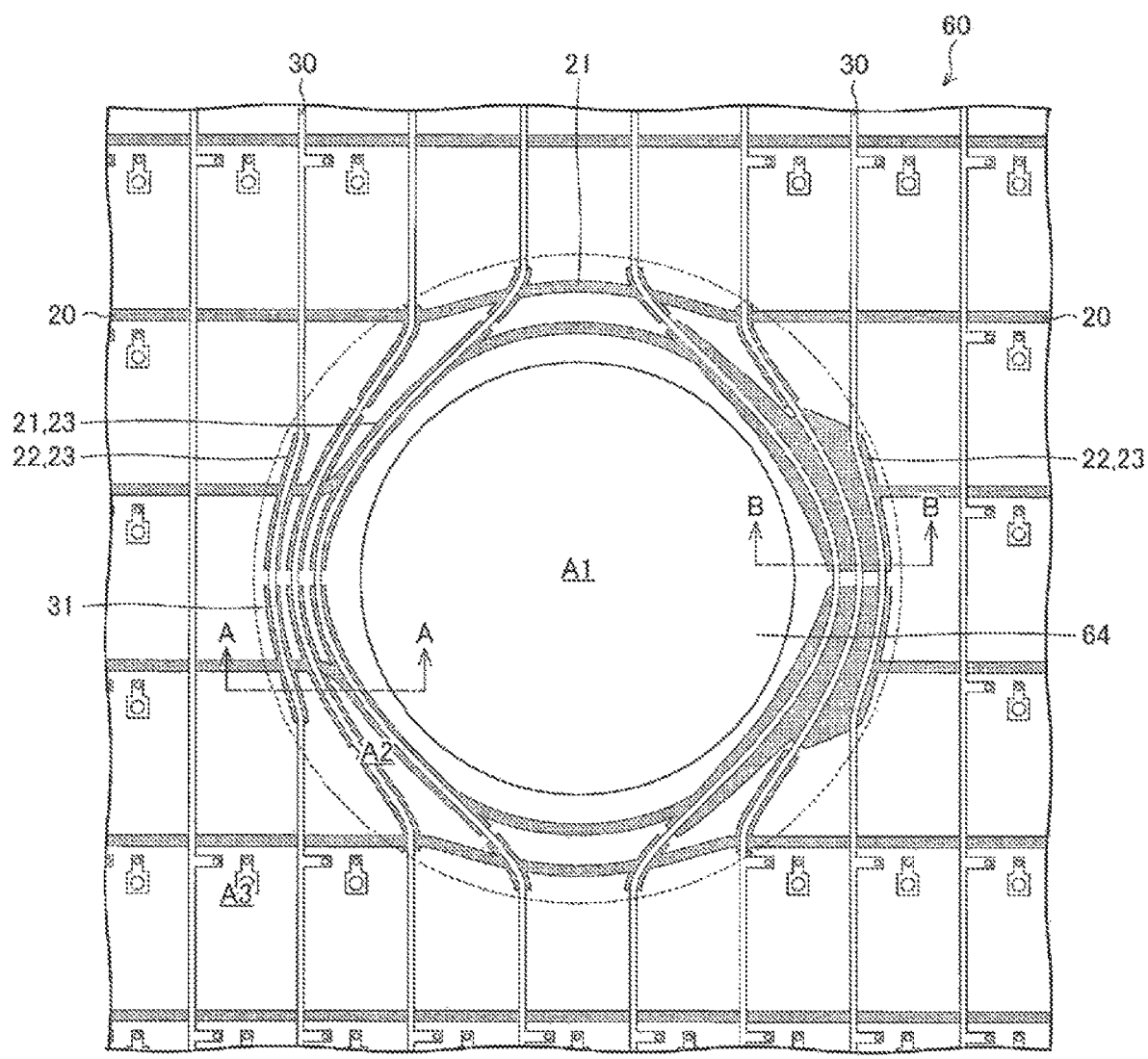
FIG. 7 is a plan view illustrating a schematic configuration of an inner non-display area of an active matrix substrate according to one embodiment of the present invention.

FIG. 7 is a plan view illustrating a schematic configuration of the inner non-display area A2 of the active matrix substrate 60 illustrated in FIG. 4. The pixel electrodes 50 and the common electrode 52 are omitted in FIG. 7 for convenience of illustration.

Figure 8:
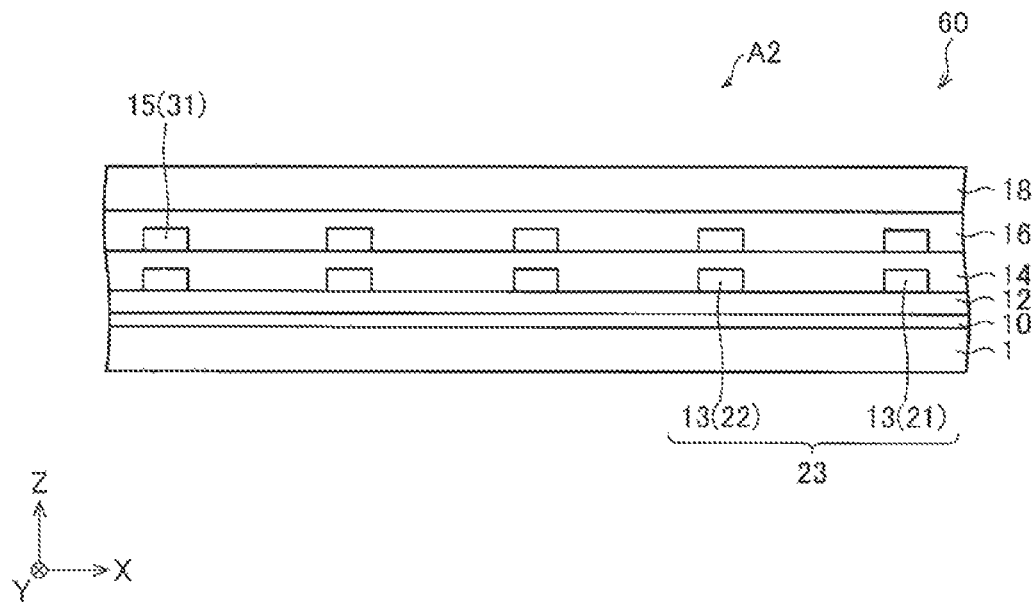
FIG. 8 is a cross-sectional view illustrating a schematic configuration of the inner non-display area of the active matrix substrate according to the one embodiment of the present invention and is a cross-sectional view taken along the AA line in FIG. 7.

FIG. 8 is a cross-sectional view illustrating a schematic configuration of the inner non-display area A2 of the active matrix substrate 60 illustrated in FIG. 4. FIG. 8 is a cross-sectional view taken along the AA line in FIG. 7.

Figure 9:
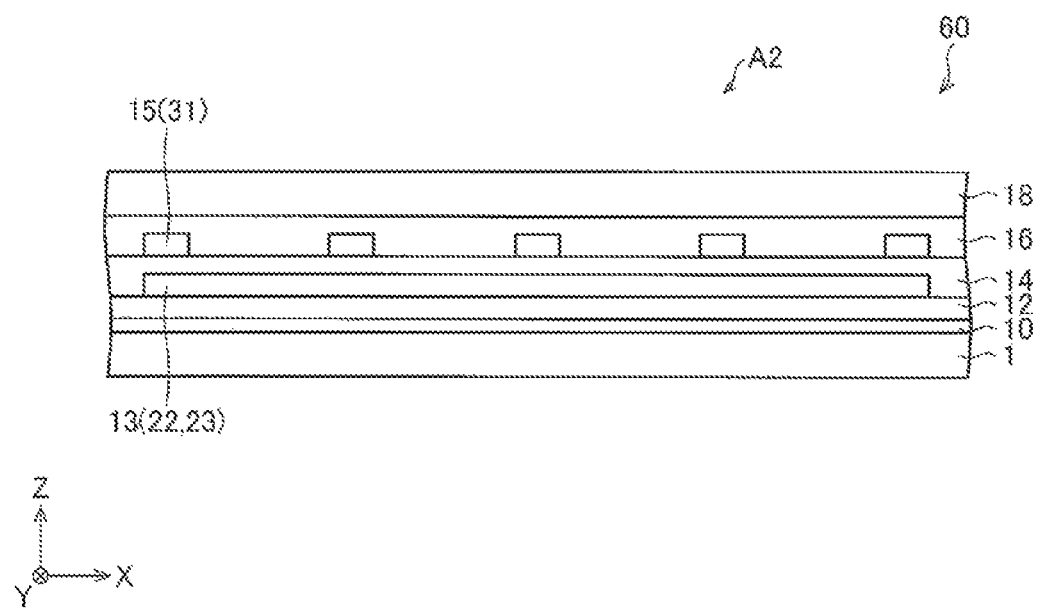
FIG. 9 is another cross-sectional view illustrating a schematic configuration of the inner non-display area of the active matrix substrate according to the one embodiment of the present invention and is a cross-sectional view taken along the BB line in FIG. 7.

FIG. 9 is another cross-sectional view illustrating a schematic configuration of the inner non-display area A2 of the active matrix substrate 60 illustrated in FIG. 4. FIG. 9 is a cross-sectional view taken along the BB line in FIG. 7.

As illustrated in FIG. 4, the active matrix substrate 60 includes an insulating substrate 1 (a substrate), multiple gate lines 20, multiple source lines 30, and multiple pixel transistors 40. As on the liquid crystal display panel 70, the opening area A1 having the opening 64 provided therein, the inner non-display area A2 around the opening 64, the display area A3, and the outer non-display area A4 along the outer periphery are set on the active matrix substrate 60. In addition, as illustrated in FIG. 5, the active matrix substrate 60 includes the pixel transistors 40 and the pixel electrodes 50 in the display area A3. Furthermore, as illustrated in FIG. 7, the active matrix substrate 60 includes lower shielding electrodes 23 in the inner non-display area A2.

The following xyz orthogonal coordinate system is used in this description.

x axis: the direction in which the gate lines 20 extend in the display area A3 y axis: the direction in which the source lines 30 extend in the display area A3 z axis: the thickness direction of the insulating substrate 1

(Insulating Substrate and Laminated Structure)

The insulating substrate 1 is preferably a transparent substrate having high transparency of visible light. For example, a glass substrate or a plastic substrate made of polyethylene terephthalate, polyimide, or the like may be used as the insulating substrate 1.

As illustrated in FIG. 6 and FIG. 8, a buffer layer 10, a semiconductor layer 11, a gate insulating film 12, a gate layer 13 (a first conductive layer), a first interlayer insulating film 14 (an insulating layer), a source layer 15 (a second conductive layer), a second interlayer insulating film 16 (an insulating layer), a first transparent conductive layer 17 (a fourth conductive layer), a third interlayer insulating film 18 (an insulating layer), and a second transparent conductive layer 19 (a third conductive layer) are laminated in this order on the insulating substrate 1.

The buffer layer 10 is formed over the entire insulating substrate 1. The buffer layer 10 is an insulating layer for buffering the difference between the lattice constant of the insulating substrate 1 and that of the semiconductor layer 11. The buffer layer 10 is, for example, a silicon oxide film or a silicon nitride film.

The semiconductor layer 11 is formed on the buffer layer 10. The semiconductor layer 11 is a semiconductor layer for forming a channel 44 that makes conduction between a source electrode 42 and a drain electrode 43 of each pixel transistor 40. The semiconductor layer 11 is made of low temperature polysilicon (LTPS) in the present embodiment. The LTPS layer is formed by, for example, crystallizing an amorphous silicon layer formed on the buffer layer 10 using a chemical vapor deposition (CVD) method through annealing by excimer laser irradiation.

The semiconductor layer 11 is not limitedly made of the LTPS and may be composed of another non-oxide semiconductor, such as amorphous silicon, or may be composed of oxide semiconductor. The oxide semiconductor composing the semiconductor layer 11 may be amorphous oxide semiconductor or may be crystalline oxide semiconductor having crystalline portions. The crystalline oxide semiconductor is, for example, polycrystal oxide semiconductor, microcrystal oxide semiconductor, or crystalline oxide semiconductor in which the c axis is oriented to a direction substantially vertical to the layer face.

The oxide semiconductor composing the semiconductor layer 11 may contain, for example, In—Ga—Zn—O based semiconductor. The In—Ga—Zn—O based semiconductor is ternary oxide containing In (indium), Ga (gallium), and Zn (zinc). The ratio (composition ratio) of In, Ga, and Zn is not specifically limited and may be, for example, In:Ga:Zn=2:2:1, In:Ga:Zn=1:1:1:, or In:Ga:Zn=1:1:2. Alternatively, the oxide semiconductor composing the semiconductor layer 11 may contain, for example, In—Sn—Zn—O based semiconductor (for example, $In_2O_3$—$SnO_2$—ZnO; InSnZnO). The In—Sn—Zn—O based semiconductor is ternary oxide containing In (indium), Sn (tin), and Zn (zinc). Alternatively, the oxide semiconductor composing the semiconductor layer 11 may contain, for example, In—Al—Zn—O based semiconductor, In—Al—Sn—Zn—O based semiconductor, Zn—O based semiconductor, In—Zn—O based semiconductor, Zn—Ti—O based semiconductor, Cd—Ge—O based semiconductor, Cd—Pb—O based semiconductor, CdO (cadmium oxide), Mg—Zn—O based semiconductor, In—Ga—Sn—O based semiconductor, In—Ga—O based semiconductor, Zr—In—Zn—O based semiconductor, or Hf—In—Zn—O based semiconductor.

The semiconductor layer 11 composed of the oxide semiconductor may have a laminated structure including two or more layers. The materials, the structures, the film forming methods, the configurations of the oxide semiconductor layers having the laminated structure, and so on of amorphous oxide semiconductor and each crystalline oxide semiconductor described above are described in, for example, Japanese Unexamined Patent Application Publication No. 2014-007399. The entire disclosure of Japanese Unexamined Patent Application Publication No. 2014-007399 is incorporated by reference in this description.

The gate insulating film 12 is formed so as to cover the surfaces of the buffer layer 10 and the semiconductor layer 11. The gate insulating film 12 is an insulating film for insulating a gate electrode 41 of each pixel transistor 40 from the channel 44. The gate insulating film 12 may be made of, for example, an organic insulating material, such as poly-para vinylphenol (PVP), or may be made of an inorganic insulating material, such as silicon dioxide (SiO2) or silicon nitride (SiNx).

The gate layer 13 is formed on the gate insulating film 12. The gate layer 13 is a conductive layer for forming the gate electrode 41 of each pixel transistor 40. The gate layer 13 may be made of, for example, a metal material, such as titanium (Ti), copper (Cu), chrome (Cr), aluminum (Al), gold (Au), molybdenum (Mo), tungsten (W), or alloy of the above materials.

The first interlayer insulating film 14 is formed on the gate insulating film 12 and the gate layer 13. The interlayer insulating films including the first interlayer insulating film 14 are insulating layers for insulation between different conductive layers or between the conductive layer and the semiconductor layer. The first interlayer insulating film 14 may be made of the same insulating material as that of the gate insulating film 12 or may be made of an insulating material different from that of the gate insulating film 12.

The gate insulating film 12 and the first interlayer insulating film 14 have contact holes provided therein. The contact holes are provided for connecting the source electrodes 42 and the drain electrodes 43 to be formed on the source layer 15 to the channels 44 formed on the semiconductor layer 11.

The source layer 15 is formed on the first interlayer insulating film 14 and inside the contact holes provided in the gate insulating film 12 and the first interlayer insulating film 14. The source layer 15 is a conductive layer for forming the source electrode 42 and the drain electrode 43 of each pixel transistor 40. The source layer 15 may be made of, for example, a metal material, such as titanium (Ti), copper (Cu), chrome (Cr), gold (Au), aluminum (Al), molybdenum (Mo), tungsten (W), or alloy of the above materials.

The second interlayer insulating film 16 is formed on the first interlayer insulating film 14 and the source layer 15. The second interlayer insulating film 16 may be made of the same insulating material as that of the gate insulating film 12 or may be made of an insulating material different from that of the gate insulating film 12, as in the first interlayer insulating film 14.

The first transparent conductive layer 17 is formed on the second interlayer insulating film 16. The first transparent conductive layer 17 is a conductive layer for forming the common electrode 52. The first transparent conductive layer 17 may be made of a transparent conductive material, such as indium oxide tin, so as to transmit light from a backlight.

The third interlayer insulating film 18 is formed on the second interlayer insulating film 16 and the first transparent conductive layer 17. The third interlayer insulating film 18 may be made of the same insulating material as that of the gate insulating film 12 or may be made of an insulating material different from that of the gate insulating film 12, as in the first interlayer insulating film 14.

The second interlayer insulating film 16 and the third interlayer insulating film 18 have contact holes provided therein. The contact holes are provided for connecting the pixel electrodes 50 to be formed on the second transparent conductive layer 19 to the source electrodes 42 formed on the source layer 15.

The second transparent conductive layer 19 is formed on the third interlayer insulating film 18 and inside the contact holes provided in the second interlayer insulating film 16 and the third interlayer insulating film 18. The second transparent conductive layer 19 is a conductive layer for forming the pixel electrodes 50. The second transparent conductive layer 19 may be made of a transparent conductive material, such as indium oxide tin, so as to transmit light from a backlight.

(Gate Lines and Source Lines)

As illustrated in FIG. 4, the gate lines 20 extend on the insulating substrate 1. The gate lines 20 extend in the x-axis direction at substantially equal intervals so as to be substantially parallel to each other in the display area A3. Part of the gate lines 20 (i) passes through the inner non-display area A2 so as to go around the opening area A1 and (ii) includes gate detour portions 21 that extend in the inner non-display area A2. Since the remaining gate lines 20 do not pass through the inner non-display area A2, the remaining gate lines 20 detour the opening area A1.

The source lines 30 extend on the insulating substrate 1 so as to intersect with the gate lines 20. The source lines 30 extend in the y-axis direction at substantially equal intervals so as to be substantially parallel to each other in the display area A3. Part of the source lines 30 (i) passes through the inner non-display area A2 so as to go around the opening area A1 and (ii) includes source detour portions 31 that extend in the inner non-display area A2. Since the remaining source lines 30 do not pass through the inner non-display area A2, the remaining source lines 30 detour the opening area A1.

The source lines 30 of the present embodiment specifically extend in the display area A3 in a zig-zag manner along the outlines of the pixel electrodes 50, as illustrated in FIG. 5. The source lines 30 are illustrated so as to have linear shapes in the drawings other than FIG. 5 for convenience of illustration.

As illustrated in FIG. 4 and FIG. 7, the adjacent interval between the gate detour portions 21 of the gate lines 20 is smaller than the adjacent interval between the gate lines 20 in the display area A3. Similarly, the adjacent interval between the source detour portions 31 of the source lines 30 is smaller than the adjacent interval between the source lines 30 in the display area A3.

As illustrated in FIG. 7, the gate detour portions 21 include expanded portions 22. The expanded portions 22 are portions resulting from expansion of the gate detour portions 21 so as to be overlapped with the source detour portions 31 in a plan view from the z-axis direction. Accordingly, most part of the source detour portions 31 is overlapped with the gate detour portions 21 or the expanded portions 22. The expanded portions 22 are preferably formed along the corresponding source detour portions 31 and are preferably wider than the corresponding source detour portions 31. The expanded portions 22 may be provided in a one-to-one correspondence with the corresponding source detour portions 31, as in FIG. 7 and FIG. 8, or may be provided so as to correspond to the multiple source detour portions 31, as in FIG. 9.

(Pixel Transistors and Pixel Electrodes)

As illustrated in FIG. 4 and FIG. 5, the pixel transistors 40 and the pixel electrodes 50 are respectively provided on the insulating substrate 1 so as to correspond to the intersections between the gate lines 20 and the source lines 30 in the display area A3. The gate electrode 41 of each pixel transistor 40 is part of the corresponding gate line 20. Specifically, in the gate line 20, a portion overlapped with the U-shaped channel 44 of the pixel transistor 40 functions as the gate electrode 41 of each pixel transistor 40. The drain electrode 43 of the pixel transistor 40 is connected to the corresponding source line 30 and the source electrode 42 thereof is connected to the corresponding pixel electrode 50.

Strictly speaking, the pixel transistors 40 and the pixel electrodes 50 are provided so that both the pixel transistor 40 and the pixel electrode 50 in each pair are included in the display area A3. In other words, the pixel electrodes 50 are provided only in the display area A3 so as to correspond to the intersections between the gate lines 20 and the source lines 30 only in the display area A3.

As illustrated in FIG. 6, the pixel transistor 40 is a top-gate thin-film transistor (TFT). The gate electrode 41 of each pixel transistor 40 is formed of the gate layer 13, the source electrode 42 and the drain electrode 43 thereof are formed of the source layer 15, and the channel 44 thereof is formed of the semiconductor layer 11. Such a structure is only an example and the pixel transistor 40 may be a TFT having another structure, such as a bottom-gate TFT, or may be a transistor other than the TFT.

As illustrated in FIG. 5, each pixel electrode 50 includes multiple openings of a broken-line shape and has the outline along the openings. The pixel electrodes 50 are illustrated in a rectangular shape and the openings of the pixel electrodes are illustrated in a linear shape in the drawings other than FIG. 5 for convenience of illustration. Such shapes are only examples and the pixel electrodes 50 may have any shape depending on the liquid crystal mode adopted by the liquid crystal display panel 70.

As illustrated in FIG. 6, the pixel electrode 50 is formed of the second transparent conductive layer 19 and is connected to the drain electrode 43 of the pixel transistor 40 via the contact hole.

(Common Electrode)

As illustrated in FIG. 6, the common electrode 52 is formed of the first transparent conductive layer 17. The common electrode 52 is an electrode that varies the arrangement of the liquid crystal molecules contained in the liquid crystal layer 72 in cooperation with the pixel electrodes 50. The arrangement of the liquid crystal molecules contained in the liquid crystal layer 72 is varied with the electric field between the common electrode 52 and the pixel electrodes 50. The common electrode 52 is provided on the opposing substrate 71, the active matrix substrate 60, or both the opposing substrate 71 and the active matrix substrate 60 depending on the variation mode of the arrangement of the liquid crystal molecules, that is, the so-called liquid crystal mode.

The liquid crystal display panel 70 of the present embodiment adopts the ITS mode. Accordingly, the common electrode 52 is provided on the insulating substrate I of the active matrix substrate 62. The common electrode 52 may have any specific known configuration depending on the liquid crystal mode adopted by the liquid crystal display panel 70.

(Gate Driver, Source Driver, and Control Circuit)

The gate driver 74 may have any known configuration. The gate driver 74 is normally a shift register circuit that selects the gate lines 20 one by one in accordance with a synchronization signal from the control circuit 76 and drives the selected gate line 20. The shift register used for the gate driver 74 may have any known configuration, and a detailed description of the configuration of the shift register is omitted herein.

The source driver 75 may have any known configuration. The source driver 75 normally selects the multiple source lines 30 in accordance with the synchronization signal from the control circuit 76 and drives the selected source lines 30 in accordance with image data from the control circuit 76. Since image signals that are concurrently supplied from the control circuit 76 normally correspond to the same color, the source driver 75 is configured so that the source lines 30 that are concurrently selected correspond to the same color.

The control circuit 76 supplies the synchronization signal to the gate driver 74 and the source driver 75. The control circuit 76 supplies the image signal corresponding to the source line 30 to be driven to the source driver 75. The control circuit 76 may have any known configuration.

(Shielding Electrode)

The lower shielding electrodes 23 are part of the conductive layer functioning as a shielding electrode for shielding the electric field at the −Z direction side of the corresponding source detour portions 31. Specifically, in the configurations illustrated in FIG. 7 to FIG. 9, the expanded portions 22 of the gate lines 20 and portions overlapped with the source detour portions 31 in the gate detour portions 21 function as the lower shielding electrodes 23 and the lower shielding electrodes 23 are formed of the gate layer 13. The use of the lower shielding electrodes 23 is capable of reducing parasitic capacitance between the corresponding source detour portions 31 and the source detour portions 31 adjacent to the corresponding source detour portions 31 through the shielding of the electric field.

For the shielding of the electric field, the coupling capacitance between the lower shielding electrodes 23 and the corresponding source detour portions 31 is preferably large. Accordingly, the lower shielding electrodes 23 are preferably formed along the corresponding source detour portions 31 and are preferably wider than the corresponding source detour portions 31. In addition, the distances between the lower shielding electrodes 23 and the corresponding source detour portions 31 are preferably short. Furthermore, since the coupling capacitance between the lower shielding electrodes 23 and the corresponding source detour portions 31 is preferably stably large, the semiconductor layer 11 is not preferably sandwiched between the lower shielding electrodes 23 and the corresponding source detour portions 31. Accordingly, only the insulating layer (the first interlayer insulating film 14) is preferably sandwiched between the lower shielding electrodes 23 and the corresponding source detour portions 31.

The conductive layer functioning as the lower shielding electrodes 23 may be a layer other than the gate layer 13. For example, when the pixel transistor 40 is a top-gate TFT, a light shielding conductive layer may be laminated between the insulating substrate 1 and the semiconductor layer 11. In this case, the lower shielding electrodes 23 are capable of being formed of the light shielding conductive layer. The lower shielding electrodes 23 may be provided so as to correspond to only part of the source detour portions 31.

(Display Quality)

Display quality will now be described in detail.

The display quality in this description means uniformity of the luminance and the color of a displayed image.

In general, the source lines 30 (i) are arranged so that the colors corresponding to the adjacent source lines 30 are different from each other and (ii) are driven in time division so that the source lines 30 that are concurrently driven correspond to the same color. For example, a simple driving order is considered, in which the source lines 30 that are arranged so as to be repeated in the order of red, blue, and green and that correspond to the respective colors: red, blue, and green are driven in time division in the order of red, blue, and green during each line period.

In such a driving order, during each line period, after the source line 30 corresponding to red is driven, the driving of the source line 30 corresponding to green affects the potential of the adjacent source tine 30 corresponding to red via the parasitic capacitance. Then, after the source lines 30 corresponding to red and green are driven, the driving of the source line 30 corresponding to blue affects the potentials of the source lines 30 corresponding to red and green through the parasitic capacitance. Accordingly, the number of times of variation in the potential, caused by the driving of the adjacent source lines 30, is two for the source lines 30 corresponding to red, is one for the source lines 30 corresponding to green, and is zero for the source lines 30 corresponding to blue.

In the display area A3, since the source lines 30 are arranged so as to be matched with the pixel pitch, the adjacent interval between the source lines 30 is relatively wide. Accordingly, since the parasitic capacitance between the adjacent source lines 30 is relatively small, the amount of variation in the potential of the source lines 30, caused by the driving of the adjacent source lines 30, is relatively small and the influence on the displayed image is also relatively small.

In contrast, in the inner non-display area A2, the adjacent interval between the source detour portions 31 of the source lines 30 is relatively narrow in order to reduce the size of the inner non-display area A2. Accordingly, since the parasitic capacitance between the source detour portions 31 of the adjacent source lines 30 is relatively large, the amount of variation in the potential of the source lines 30, caused by the driving of the adjacent source lines 30, is relatively large to reduce the display quality. In addition, since the number of times of variation is varied from zero to two depending on the source lines 30, the reduction in the display quality is increased. Specifically, if the amount of variation in the potential of the source lines 30 that are varied twice reaches a visible level, periodical vertical stripes extending from the inner non-display area A2 in the y-axis direction are visible in the displayed image, thus greatly reducing the display quality.

Accordingly, reducing the parasitic capacitance between the source detour portions 31 is useful for reducing the reduction in the display quality in portions corresponding to the source lines 30 including the source detour portions 31 in the display area A3. In particular, reducing the parasitic capacitance between the source detour portions 31 so that the amount of variation in the potential of the source lines 30 that are varied twice does not reach a visible level is more useful for reducing the reduction in the display quality.

Consequently, when the lower shielding electrodes 23 are provided only for part of the source detour portions 31, the lower shielding electrodes 23 are preferably provided for the source detour portions 31 included in (i) the source lines 30 that are varied twice and (ii) the source lines 30 adjacent to the source lines 30 that are varied twice in consideration of the driving order.

The driving order of the source lines 30 is practically often more complicated than the simple driving order described above. For example, the source lines 30 corresponding to the respective colors: red, green, and blue may be driven in a driving order from T1 to T6 described below. K is a natural number.

T1: the source lines 30 corresponding to (4K−3)-th red and (4K−2)-th red

T2: the source lines 30 corresponding to (4K−3)-th green and (4K−2)-th green

T3: the source lines 30 corresponding to (4K−3)-th blue and (4K−2)-th blue

T4: the source lines 30 corresponding to (4K−1)-th red and 4K-th red

T5: the source lines 30 corresponding to (4K−1)-th green and 4K-th green

T6: the source lines 30 corresponding to (4K−1)-th blue and 4K-th blue

In such a driving order, the potentials of the source lines 30 corresponding to (4K−3)-th red and (4K−2)-th red, which are driven in T1, and the potential of the source line 30 corresponding to (4K−1)-th red and 4K-th red, which is driven in T4, are varied twice due to the driving of the adjacent source lines 30. In addition, the potential of the source line 30 corresponding to (4K−1)-th blue and (4K−2)-th blue, which is driven in T3, and the potentials of the source lines 30 corresponding to (4K−1)-th blue and 4K-th blue, which are driven in T6, are not varied.

Accordingly, provision of the lower shielding electrodes 23 for all the source detour portions 31 is preferable to provision of the lower shielding electrodes 23 only for part of the source detour portions 31 because of simplification of the provision of the lower shielding electrodes 23.

(Advantages)

With the configuration according to the first embodiment, the use of the lower shielding electrodes 23 reduces the parasitic capacitance between the gate detour portions 21 corresponding to the lower shielding electrodes 23 and the source detour portions 31 adjacent to the source detour portions 31 corresponding to the lower shielding electrodes 23. Accordingly, the configuration according to the first embodiment is capable of reducing the reduction in the display quality in the portions corresponding to the source lines 30 including the source detour portions 31 in the display area A3, compared with a configuration without the lower shielding electrodes 23. In addition, since the wiring space of the source detour portions 31 is capable of being reduced by decreasing the adjacent interval between the source detour portions 31 while keeping the display quality in the portions corresponding to the source lines 30 including the source detour portions 31 in the display area A3, it is possible to reduce the size of the inner non-display area A2.

Second Embodiment

Another embodiment of the present invention will now be described with reference to FIG. 10. The same reference numerals are given to the components having the same functions as those of the components described in the above embodiment for convenience and a description of such components is omitted herein.

An active matrix substrate 61 according to a second embodiment includes the insulating substrate 1, the multiple gate lines 20, the multiple source lines 30, the multiple pixel transistors 40, the pixel electrodes 50, and the lower shielding electrodes 23, as in the active matrix substrate 60 according to the first embodiment described above. The opening area A1 having the opening 64 provided therein, the inner non-display area A2 around the opening 64, the display area A3, and the outer non-display area A4 along the outer periphery are set on the active matrix substrate 61 according to the second embodiment, as in the active matrix substrate 60 according to the first embodiment described above.

The active matrix substrate 61 according to the second embodiment differs from the active matrix substrate 60 according to the first embodiment described above only in the lower shielding electrodes 23 and is equivalent to the active matrix substrate 60 according to the first embodiment described above in the remaining configuration. Specifically, in the configuration illustrated in FIG. 10, separated portions 24 of the gate lines 20 and portions overlapped with the source detour portions 31 in the gate detour portions 21 function as the lower shielding electrodes 23.

Figure 10:
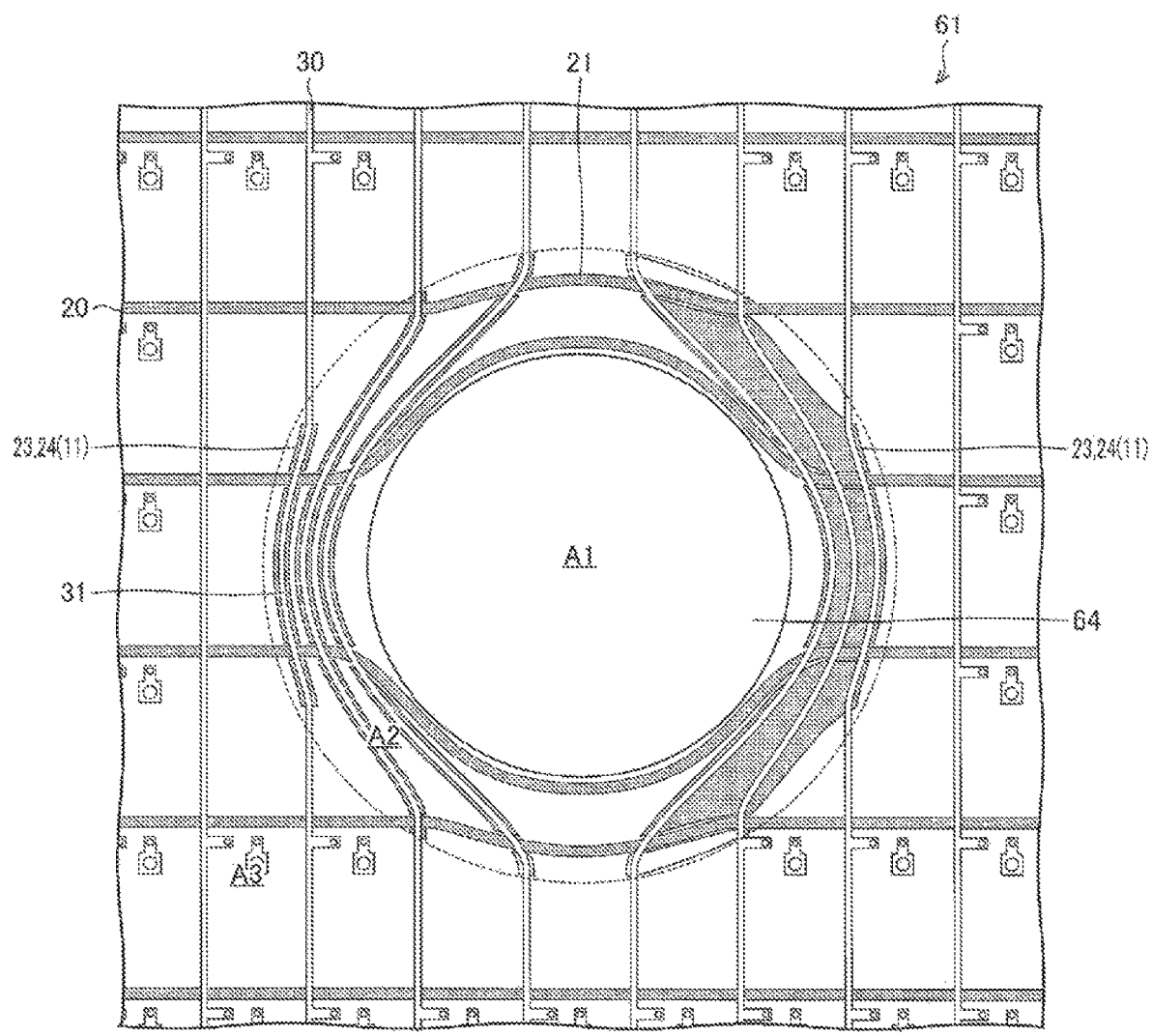
FIG. 10 is a plan view illustrating a schematic configuration of the inner non-display area of an active matrix substrate according to one embodiment of the present invention.

FIG. 10 is a plan view illustrating a schematic configuration of the inner non-display area A2 of the active matrix substrate 61 according to the second embodiment of the present invention. The pixel electrodes 50 and the common electrode 52 are omitted in FIG. 10 for convenience of illustration.

As illustrated in FIG. 10, in the second embodiment, the gate detour portions 21 of the gate lines 20 do not have the expanded portions 22. Instead of the expanded portions 22, the separated portions 24 separated from the gate lines 20 are formed of the gate layer 13. The separated portions 24 are formed so as to be overlapped with the source detour portions 31 of the source lines 30 in a plan view from the z-axis direction. Accordingly, most part of the source detour portions 31 of the source lines 30 is overlapped with the separated portions 24. The separated portions 24 are preferably formed along the corresponding source detour portion 31 and are preferably wider than the corresponding source detour portions 31. The separated portions 24 may be provided in a one-to-one correspondence with the corresponding source detour portions 31, as illustrated on the left side in FIG. 10, or may be provided so as to correspond to the multiple source detour portions 31, as illustrated on the right side in FIG. 10.

Since the separated portions 24 are separated from the gate lines 20, the separated portions 24 may be floating electrodes or may be connected to lines or electrodes other than the gate lines 20. The separated portions 24 are preferably connected to electrodes or lines having substantially constant potential and the potentials of the electrodes or lines to which the separated portions 24 are connected are more preferably ground potential or near the ground potential in order for the separated portions 24 to function as the lower shielding electrodes 23. The electrodes or lines having substantially constant potential include, for example, the common electrode 52 provided on the insulating substrate 1, lines for supplying common potential to the common electrode 52, dedicated ground lines for grounding the separated portions 24, auxiliary capacitance lines, high-potential power lines, and low-potential power lines. The common potential is normally constant potential close to the ground potential.

(Advantages)

With the configuration according to the second embodiment, it is possible to reduce the reduction in the display quality in the portions corresponding to the source lines 30 including the source detour portions 31 in the display area A3, as in the configuration according to the first embodiment described above. In addition, it is possible to reduce the size of the inner non-display area A2 while keeping the display quality in the portions corresponding to the source lines 30 including the source detour portions 31 in the display area A3.

Furthermore, with the configuration according to the second embodiment, the separated portions 24 functioning as the lower shielding electrodes 23 may be floating electrodes or may be connected to lines or electrodes other than the gate lines 20.

The configuration according to the second embodiment may be combined with the configuration according to the first embodiment described above. For example, the expanded portions 22 may be provided for part of the source detour portions 31 and the separated portions 24 may be provided for another part of the source detour portions 31 as the lower shielding electrodes 23.

Third Embodiment

Another embodiment of the present invention will now be described with reference to FIG. 11. The same reference numerals are given to the components having the same functions as those of the components described in the above embodiments for convenience and a description of such components is omitted herein.

An active matrix substrate 62 according to a third embodiment includes the insulating substrate 1, the multiple gate lines 20, the multiple source lines 30, the multiple pixel transistors 40, and the pixel electrodes 50, as in the active matrix substrates 60 to 61 according to the first to second embodiments described above. The opening area A1 having the opening 64 provided therein, the inner non-display area A2 around the opening 64, the display area A3, and the outer non-display area A4 along the outer periphery are set on the active matrix substrate 62 according to the third embodiment, as in the active matrix substrates 60 to 61 according to the first to second embodiments described above.

The active matrix substrate 62 according to the third embodiment differs from the active matrix substrates 60 to 61 according to the first to second embodiments described above only in that the active matrix substrate 62 does not include the lower shielding electrodes 23 and includes an upper shielding electrode 51 and is equivalent to the active matrix substrates 60 to 61 according to the first to second embodiments described above in the remaining configuration.

(Upper Shielding Electrode)

Figure 11:
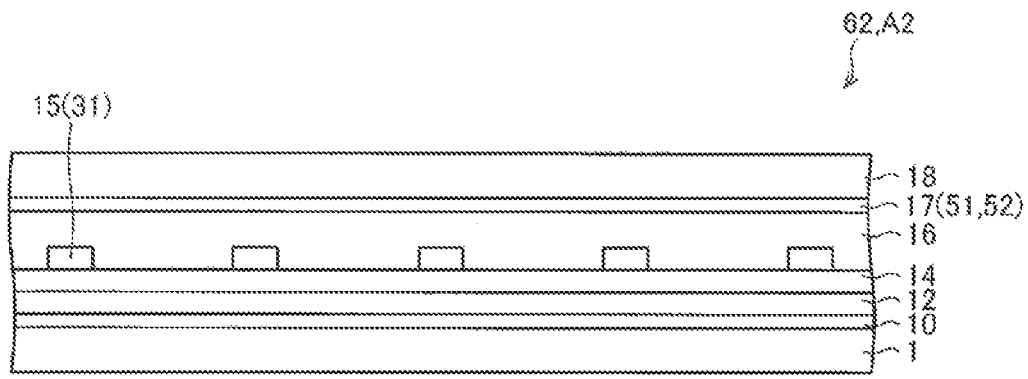
FIG. 11 is a cross-sectional view illustrating a schematic configuration of the inner non-display area of an active matrix substrate according to one embodiment of the present invention.
Figure 11:
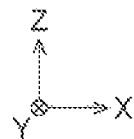

FIG. 11 is a cross-sectional view illustrating a schematic configuration of the inner non-display area A2 of the active matrix substrate 62 according to the third embodiment.

As illustrated in FIG. 11, the upper shielding electrode 51 is part of the conductive layer functioning as the shielding electrode for shielding the electric field at the +Z direction side of the corresponding source detour portions 31 of the source lines 30. The upper shielding electrode 51 is formed of the first transparent conductive layer 17, as illustrated in FIG. 11, and is overlapped with the corresponding source detour portions 31 in a plan view from the z-axis direction. The use of the upper shielding electrode 51 is capable of reducing the parasitic capacitance between the corresponding gate detour portions 21 of the source lines 30 and the gate detour portions 21 adjacent to the corresponding gate detour portions 21 through the shielding of the electric field.

Referring to FIG. 6 and FIG. 11, the upper shielding electrode 51 and the common electrode 52 are formed on the same first transparent conductive layer 17. Conversely, in the first transparent conductive layer 17, a portion in the display area A3 functions as the common electrode 52 and a portion in the inner non-display area A2 functions as the upper shielding electrode 51.

The upper shielding electrode 51 may be a floating electrode or may be connected to desired lines or electrodes. The upper shielding electrode 51 is preferably connected to electrodes or lines having substantially constant potential and the potentials of the electrodes or lines to which the upper shielding electrode 51 is connected are more preferably the ground potential or near the ground potential in order to shield the electric field. The electrodes or lines having substantially constant potential include, for example, the common electrode 52 provided on the insulating substrate 1, a line for supplying the common potential to the common electrode 52, a dedicated ground line for grounding the upper shielding electrode 51, an auxiliary capacitance line, a high-potential power line, and a low-potential power line. In particular, the upper shielding electrode 51 is preferably connected to the common electrode 52. This is because, in this case, the upper shielding electrode 51 and the common electrode 52 are capable of being integrally formed and the upper shielding electrode 51 is easily formed.

The upper shielding electrode 51 may be provided in a one-to-one correspondence with the corresponding source detour portions 31 or may be provided so as to correspond to the multiple source detour portions 31, as in the lower shielding electrodes 23. The conductive layer functioning as the upper shielding electrode 51 may be a conductive layer other than the first transparent conductive layer 17. For example, the upper shielding electrode 51 may be formed of the second transparent conductive layer 19 on which the pixel electrodes 50 are formed. In this case, in order to simplify the patterning of the second transparent conductive layer 19, the shape of the upper shielding electrode 51 is preferably approximately the same as the shape of the pixel electrodes 50 or the shape of the inner non-display area A2. In addition, when the pixel transistor 40 is a top-gate TFT, the source layer 15 may be laminated between the insulating substrate 1 and the gate layer 13. In this case, the upper shielding electrode 51 is capable of being formed of the gate layer 13. Furthermore, the upper shielding electrode 51 may be provided so as to correspond to only part of the source detour portions 31.

(Advantages)

With the configuration according to the third embodiment, it is possible to reduce the reduction in the display quality in the portions corresponding to the source lines 30 including the source detour portions 31 in the display area A3, as in the configuration according to the first embodiment described above. In addition, it is possible to reduce the size of the inner non-display area A2 while keeping the display quality in the portions corresponding to the source lines 30 including the source detour portions 31 in the display area A3.

Furthermore, with the configuration according to the third embodiment, the upper shielding electrode 51 may be a floating electrode or may be connected to lines or electrodes other than the gate lines 20.

Fourth Embodiment

Another embodiment of the present invention will now be described with reference to FIG. 12. The same reference numerals are given to the components having the same functions as those of the components described in the above embodiments for convenience and a description of such components is omitted herein.

An active matrix substrate 63 according to a fourth embodiment includes the insulating substrate 1, the multiple gate lines 20, the multiple source lines 30, the multiple pixel transistors 40, and the pixel electrodes 50, as in the active matrix substrate 60 to 62 according to the first to third embodiments described above. The opening area A1 having the opening 64 provided therein, the inner non-display area A2 around the opening 64, the display area A3, and the outer non-display area A4 along the outer periphery are set on the active matrix substrate 63 according to the fourth embodiment, as in the active matrix substrate 60 according to the first embodiment described above.

The active matrix substrate 63 according to the fourth embodiment differs from the active matrix substrates 60 to 62 according to the first to third embodiments described above only in that the active matrix substrate 63 includes both the lower shielding electrodes 23 and the upper shielding electrode 51 and is equivalent to the active matrix substrates 60 to 62 according to the first to third embodiments described above in the remaining configuration.

The lower shielding electrodes 23 according to the fourth embodiment may be the gate detour portions 21 and the expanded portions 22, as in the first embodiment described above, may be the gate detour portions 21 and the separated portions 24, as in the second embodiment described above, or may be the gate detour portions 21, the expanded portions 22, and the separated portions 24, as in the combination of the first to second embodiments described above.

Figure 12:
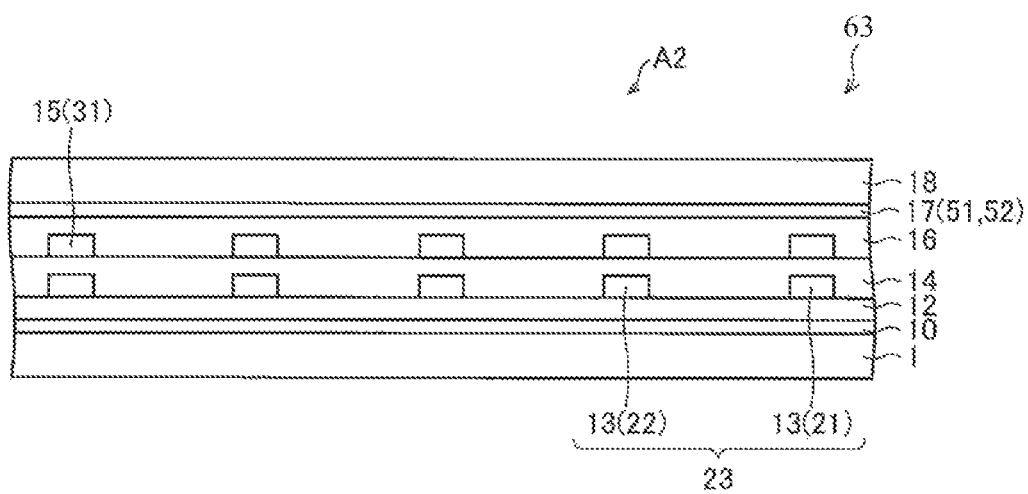
FIG. 12 is a cross-sectional view illustrating a schematic configuration of the inner non-display area of an active matrix substrate according to one embodiment of the present invention.
Figure 12:
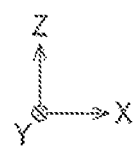

FIG. 12 is a cross-sectional view illustrating a schematic configuration of the inner non-display area A2 of the active matrix substrate 63 according to the fourth embodiment.

As illustrated in FIG. 12, the active matrix substrate 63 includes both the lower shielding electrodes 23 and the upper shielding electrode 51. Accordingly, the electric field at the −Z direction side of the source detour portions 31 is shielded by the corresponding lower shielding electrodes 23 and the electric field at the +Z direction side of the source detour portions 31 is shielded by the corresponding upper shielding electrode 51. Consequently, since the source detour portions 31 are further shielded with the configuration according to the fourth embodiment, compared with the first to third embodiments described above, it is possible to further reduce the parasitic capacitance between the source detour portions 31 that are adjacent to each other.

(Advantages)

Accordingly, with the configuration according to the fourth embodiment, it is possible to further reduce the reduction in the display quality in the portions corresponding to the source lines 30 including the source detour portions 31 in the display area A3, compared with the configurations according to the first to third embodiments described above. In addition, it is possible to further reduce the size of the inner non-display area A2 while keeping the display quality in the portions corresponding to the source lines 30 including the source detour portions 31 in the display area A3.

Furthermore, with the configuration according to the fourth embodiment, the separated portions 24 functioning as the lower shielding electrodes 23 may be floating electrodes or may be connected to lines or electrodes other than the gate lines 20.

Fifth Embodiment

Another embodiment of the present invention will now be described with reference to FIG. 13 to FIG. 16. The same reference numerals are given to the components having the same functions as those of the components described in the above embodiments for convenience and a description of such components is omitted herein.

A method of manufacturing the active matrix substrate according to a fifth embodiment is a manufacturing method for manufacturing the active matrix substrate 63 according to the fourth embodiment described above.

Figure 13:
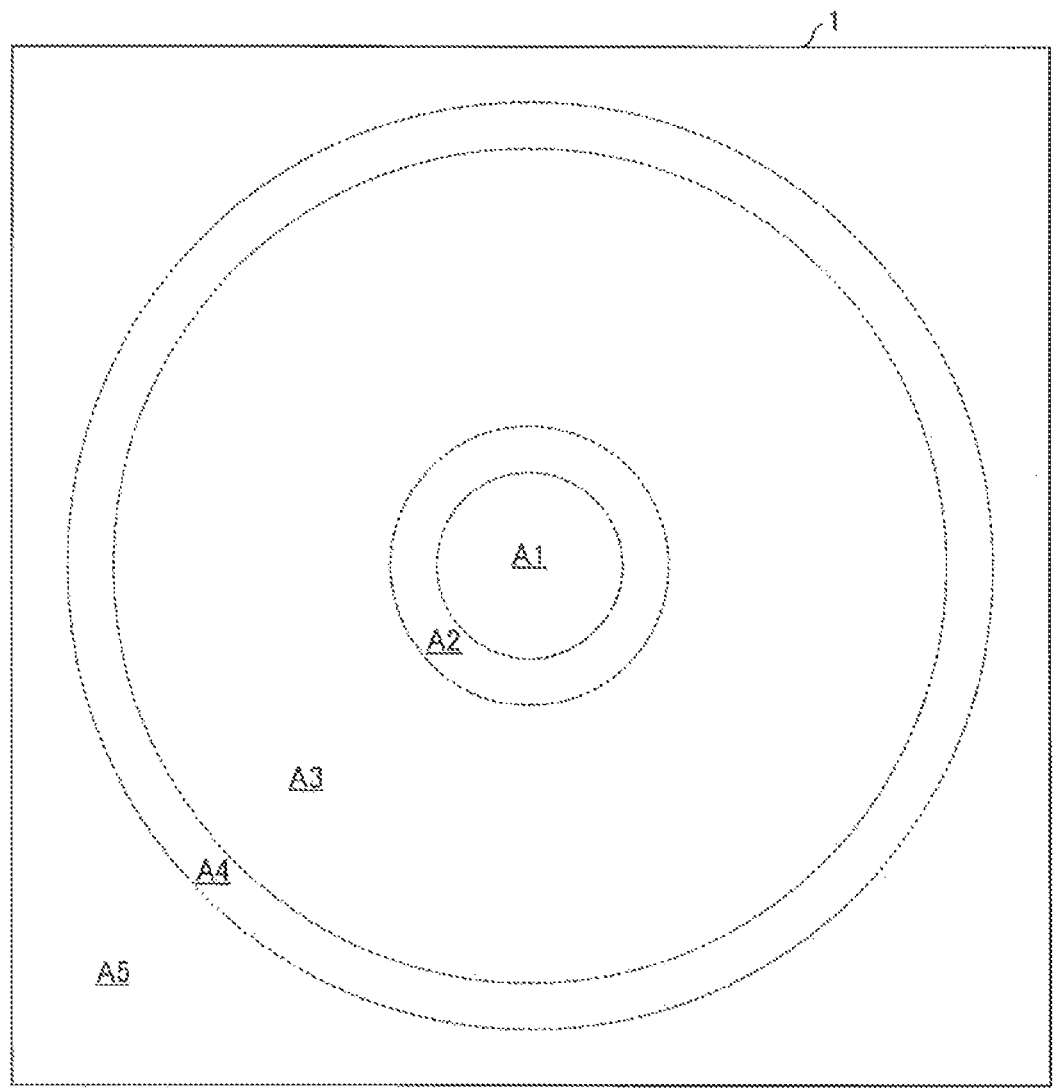
FIG. 13 is a diagram illustrating part of a method of manufacturing the active matrix substrate according to one embodiment of the present invention.

FIG. 13 is a diagram illustrating part of the method of manufacturing the active matrix substrate according to the fifth embodiment.

Figure 14:
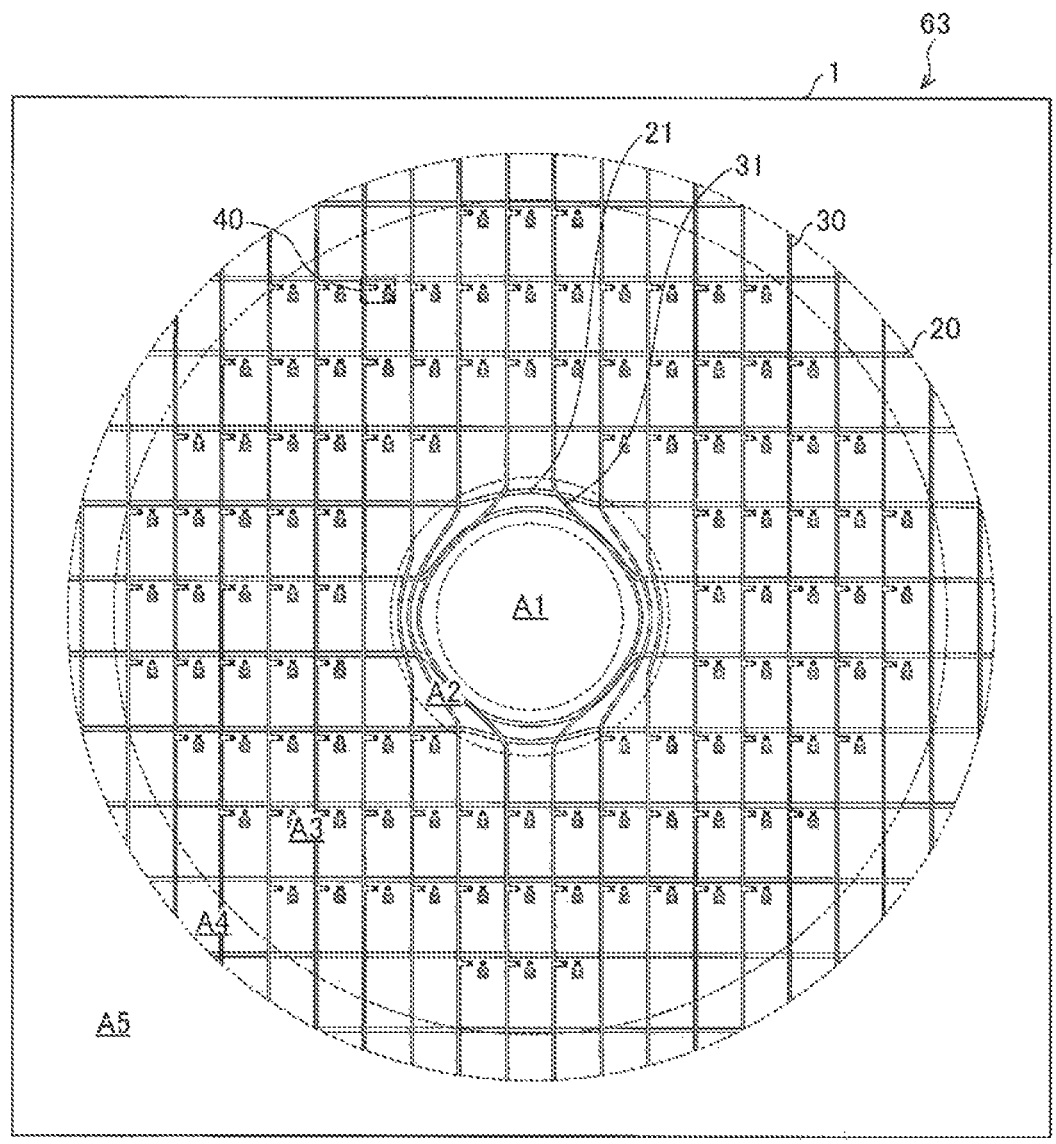
FIG. 14 is a diagram illustrating part of the method of manufacturing the active matrix substrate according to the one embodiment of the present invention.

FIG. 14 is a diagram illustrating part of the method of manufacturing the active matrix substrate according to the fifth embodiment.

Figure 15:
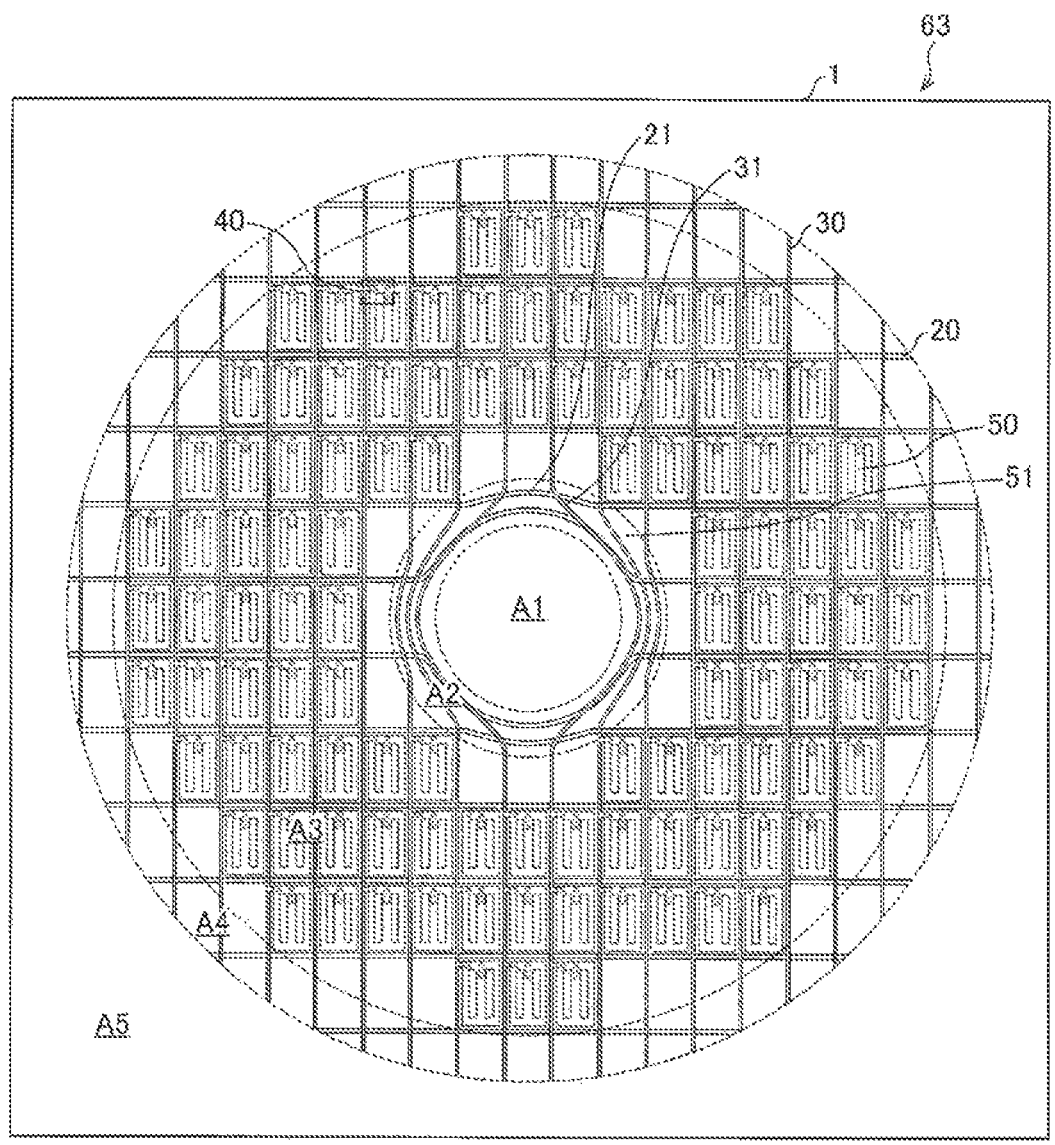
FIG. 15 is a diagram illustrating part of the method of manufacturing the active matrix substrate according to the one embodiment of the present invention.

FIG. 15 is a diagram illustrating part of the method of manufacturing the active matrix substrate according to the fifth embodiment. The common electrode 52 and the upper shielding electrode 51 to be formed on the first transparent conductive layer 17 are omitted in FIG. 15 for convenience of illustration.

Figure 16:
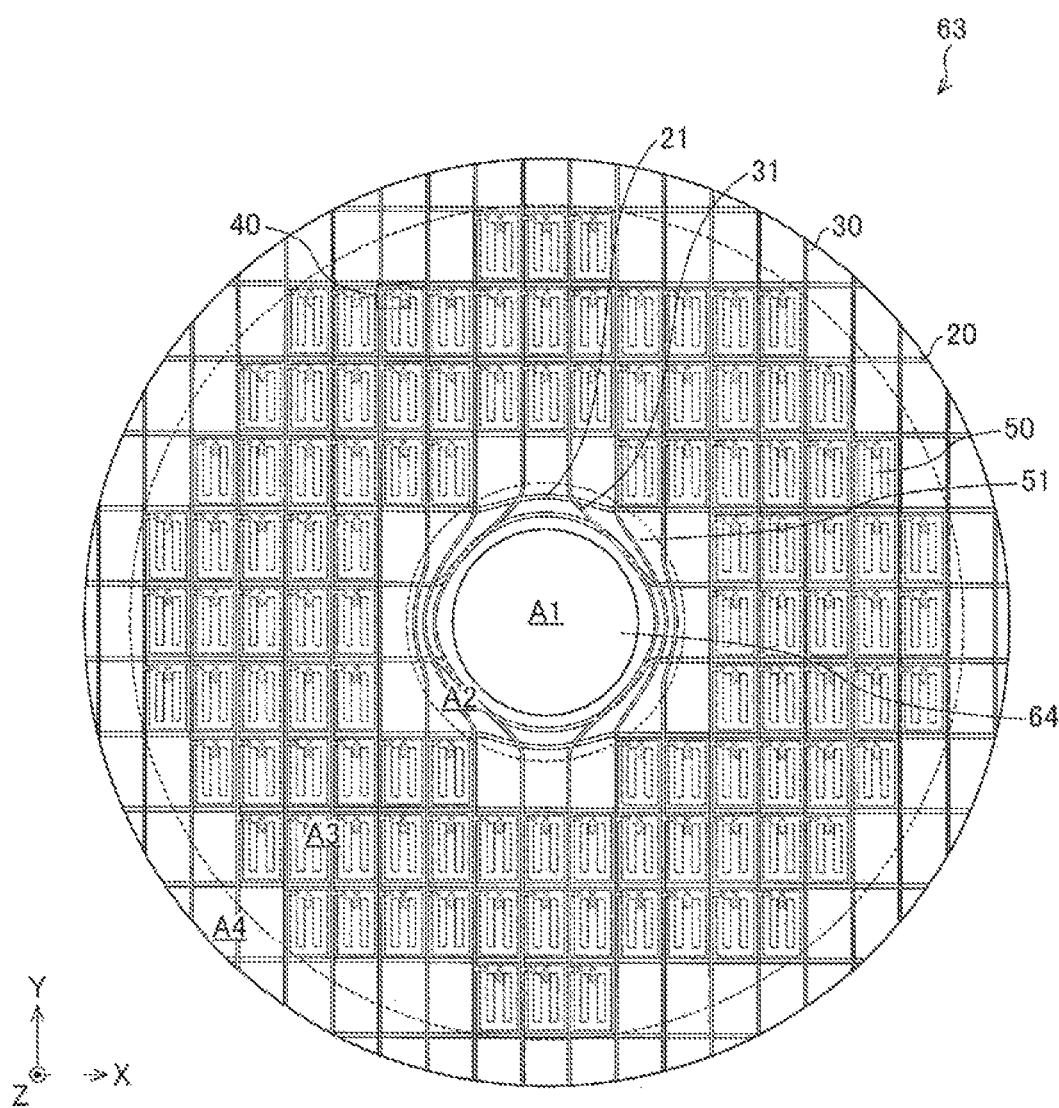
FIG. 16 is a diagram illustrating part of the method of manufacturing the active matrix substrate according to the one embodiment of the present invention.

FIG. 16 is a diagram illustrating part of the method of manufacturing the active matrix substrate according to the fifth embodiment.

First, as illustrated in FIG. 13, the opening area A1, the inner non-display area A2 at the outer side of the opening area A1, the display area A3 at the outer side of the inner non-display area A2, the outer non-display area A4 at the outer side of the display area A3, and a cut-out area A5 at the outer side of the outer non-display area A4 are set on the insulating substrate 1 (a first step).

Next, the buffer layer 10 is vapor-deposited on the entire surface of the insulating substrate 1 and the semiconductor layer 11 is vapor-deposited on the entire surface of the buffer layer 10. Then, the channels 44 (refer to FIG. 6) of the pixel transistors 40 are formed on the semiconductor layer 11 using, for example, a photolithography technique.

Next, the gate insulating film 12 is vapor-deposited on the entire surface and the gate layer 13 is vapor-deposited on the entire surface. Then, the gate lines 20 including the gate detour portions 21 and the gate electrodes 41 of the pixel transistors 40 are formed on the gate layer 13 using, for example, the photolithography technique, as illustrated in FIG. 14 (a second step). At this time, the expanded portions 22 (refer to FIG. 7) and/or the separated portions 24 (refer to FIG. 10), which function as the lower shielding electrodes 23, are also formed on the gate layer 13 (a fifth step).

Next, the first interlayer insulating film 14 (the insulating layer) is vapor-deposited on the entire surface, the contact holes for connecting the source electrodes 42 and the drain electrodes 43 to the channels 44 are formed, and the source layer 15 is vapor-deposited on the entire surface. Then, the source lines 30 including the source detour portions 31 and the source electrodes 42 and the drain electrodes 43 of the pixel transistors 40 are formed on the source layer 15 using, for example, the photolithography technique, as illustrated in FIG. 14 (a third step).

Next, the second interlayer insulating film 16 is vapor-deposited on the entire surface and the first transparent conductive layer 17 is vapor-deposited on the entire surface. Then, the upper shielding electrode 51 and the common electrode 52 are formed on the first transparent conductive layer 17 using, for example, the photolithography technique (the fifth step).

Next, the third interlayer insulating film 18 is vapor-deposited on the entire surface, the contact holes for connecting the pixel electrodes 50 to the source electrodes 42 are formed, and the second transparent conductive layer 19 is vapor-deposited on the entire surface. Then, the pixel electrodes 50 are formed on the second transparent conductive layer 19 using, for example, the photolithography technique, as illustrated in FIG. 15 (a fourth step).

Finally, the opening 64 is formed in the opening area A1 and the cut-out area A5 is cut out, as illustrated in FIG. 16.

The active matrix substrate 63 according to the fourth embodiment described above is capable of being manufactured through the above steps. In addition, the liquid crystal display panel 70 illustrated in FIG. 2 and FIG. 3 is capable of being manufactured by sealing the liquid crystal layer 72 with the sealing material 73 between the active matrix substrate 63 and the opposing substrate 71.

Furthermore, the active matrix substrate 60 according to the first embodiment described above is capable of being manufactured by modifying the above steps so as to form the expanded portion 22 functioning as the lower shielding electrode 23 and so as not to form the separated portions 24 and the upper shielding electrode 51. Similarly, the active matrix substrate 61 according to the second embodiment described above is capable of being manufactured by modifying the above steps so as to form the separated portions 24 functioning as the lower shielding electrode 23 and so as not to form the expanded portions 22 and the upper shielding electrode 51. Similarly, the active matrix substrate 62 according to the third embodiment described above is capable of being manufactured by modifying the above steps so as to form the upper shielding electrode 51 and so as not to form the expanded portions 22 and the separated portions 24 functioning as the lower shielding electrode 23.

(Advantages)

Accordingly, with the manufacturing method and the modifications according to the fifth embodiment, it is possible to manufacture the active matrix substrates 60 to 63 having the configurations according to the first to fourth embodiments described above.

[Summary]

Active matrix substrates (60 to 63) according to a first aspect of the present invention include a substrate (an insulating substrate 1) on which an opening area (A1), an inner non-display area (A2) at an outer side of the opening area, and a display area (A3) at the outer side of the inner non-display area are set; multiple gate lines (20) and multiple source lines (30) intersecting with the gate lines, which extend on the substrate so as to detour the opening area; and multiple pixel electrodes (50) provided in the display area on the substrate so as to correspond to intersections between the gate lines and the source lines only the display area. Part of the source lines includes source detour portions (31) passing through the inner non-display area. The active matrix substrates further include shielding electrodes (at least one of gate detour portions 21, expanded portions 22, and separated portions 24 functioning as lower shielding electrodes 23 and/or an upper shielding electrode 51) provided in the inner non-display area on the substrate so as to be overlapped with part or all of the source detour portions in a plan view.

With the above configuration, the gate lines and the source lines extend so as to detour the opening area. Accordingly, an opening is capable of being formed in the opening area without damaging the gate lines and the source lines.

With the above configuration, since the shielding electrodes are provided so as to be overlapped with part or all of the source detour portions, the shielding electrodes shield the electric field of the corresponding source detour portions. Accordingly, the shielding electrodes are capable of reducing parasitic capacitance between the corresponding source detour portions and the source detour portions adjacent to the corresponding source detour portions.

Due to the reduction in the parasitic capacitance, since the amount of variation in the potential of the source lines, caused by the driving of the adjacent source lines in the inner non-display area, is capable of being reduced, the influence on a displayed image is capable of being reduced. Accordingly, it is possible to reduce a reduction in the display quality in portions corresponding to the source lines including the source detour portions in the display area. Alternatively, since the wiring space of the source detour portions is capable of being reduced by decreasing the adjacent interval between the source detour portions while keeping the display quality in the portions corresponding to the source lines including the source detour portions in the display area, it is possible to reduce the size of the inner non-display area.

In the active matrix substrates (60, 61, 63) according to a second aspect of the present invention, in the first aspect described above, the shielding electrodes may include lower shielding electrodes (the lower shielding electrodes 23 and at least one of the gate detour portions 21, the expanded portions 22, and the separated portions 24 functioning as the lower shielding electrodes 23) provided closer to the substrate side (at the −Z direction side) than the corresponding source detour portions (31).

With the above configuration, since the shielding electrodes include the lower shielding electrodes provided at the substrate side, it is possible to shield the electric field at the substrate side of the corresponding source detour portions.

In the active matrix substrates (60, 61, 63) according to a third aspect of the present invention, in the second aspect described above, a first conductive layer (a gate layer 13) having the gate lines (30) formed thereon may be laminated closer to the substrate side (at the −Z direction side) than a second conductive layer (a source layer 15) having the source lines (30) formed thereon, and the lower shielding electrodes (23) may be formed of the first conductive layer.

With the above configuration, the lower shielding electrodes are formed of the first conductive layer having the gate lines formed thereon. Accordingly, the lower shielding electrodes are capable of being easily connected to the gate lines, other lines or electrodes formed of the first conductive layer, or other lines or electrodes formed of another conductive layer laminated closer to the substrate side than the first conductive layer.

The other lines formed of the first conductive layer or another conductive layer laminated closer to the substrate side than the first conductive layer include, for example, a common electrode provided on the substrate, lines for supplying common potential to the common electrode, auxiliary capacitance lines, high-potential power lines, and low-potential power lines.

In the active matrix substrate (60) according to a fourth aspect of the present invention, in the third aspect described above, part of the gate lines (20) may include gate detour portions (21) passing through the inner non-display area (A2), and part or all of the lower shielding electrodes (23) (the gate detour portions 21 and/or the expanded portions 22) may be connected to the gate detour portions.

With the above configuration, part or all of the lower shielding electrodes are connected to the gate detour portions. The potential of the gate lines is (i) an off-voltage that keeps a non-conductive state between the sources and the drains of the pixel transistors during a period excluding a scanning period in which writing into the corresponding pixel electrodes is performed and (ii) an on-voltage that keeps a conductive state between the sources and the drains of the pixel transistors only during the scanning period in which writing into the corresponding pixel electrodes is performed.

Accordingly, the potential of the gate lines and the potential of part or all of the lower shielding electrodes connected to the gate detour portions may be practically considered as constant potential, which is the off-voltage. Consequently, it is possible to reduce the variation in the potential of the source lines, caused by the variation in the potential of part or all of the lower shielding electrodes.

In the active matrix substrates (62, 63) according to a fifth aspect of the present invention, in one aspect of the first to fourth aspects described above, the shielding electrodes may include an upper shielding electrode (51) provided at a side (at the +Z direction side) of the substrate, which is opposite to that of the corresponding source detour portions (31).

With the above configuration, since the shielding electrodes include the upper shielding electrode provided at the opposite side of the substrate, it is possible to shield the electric field of the source detour portions at the opposite side of the substrate to reduce the parasitic capacitance between the adjacent source detour portions.

In the active matrix substrates (62, 63) according to a sixth aspect of the present invention, in the fifth aspect described above, a third conductive layer (a second transparent conductive layer 19) having the pixel electrodes (50) formed thereon may be laminated at a side (at the +Z direction side) of the substrate, which is opposite to that of the second conductive layer (the source layer 15) having the source lines (30) formed thereon, and the upper shielding electrode (51) may be formed of the third conductive layer.

With the above configuration, the upper shielding electrode is formed of the third conductive layer having the pixel electrodes formed thereon. Accordingly, the upper shielding electrode is capable of being easily connected to other lines or electrodes formed of the third conductive layer or other lines or electrodes formed of another conductive layer laminated at a side of the substrate, which is opposite to that of the third conductive layer.

The active matrix substrates (62, 63) according to a seventh aspect of the present invention may further include a common electrode (52) in the fifth aspect described above. A fourth conductive layer (a first transparent conductive layer 17) having the common electrode (52) formed thereon may be laminated at a side (at the +Z direction side) of the substrate, which is opposite to that of the second conductive layer (the source layer 15) having the source lines (30) formed thereon, and the upper shielding electrode (51) may be formed of the fourth conductive layer.

With the above configuration, the upper shielding electrode is formed of the fourth conductive layer having the common electrode formed thereon. Accordingly, the upper shielding electrode is capable of being easily connected to the common electrode formed of the fourth conductive layer or other lines or electrodes formed of another conductive layer laminated at a side of the substrate, which is opposite to that of the fourth conductive layer.

In the active matrix substrates (60 to 63) according to an eighth aspect of the present invention, in one aspect of the first to seventh aspects described above, part or all of the shielding electrodes (at least one of the gate detour portions 21, the expanded portions 22, and the separated portions 24 functioning as the lower shielding electrodes 23 and/or the upper shielding electrode 51) may be connected to electrodes or lines having the constant potential.

With the above configuration, since part or all of the shielding electrodes are connected to electrodes or lines having the constant potential, the potential of the part or all of the shielding electrodes is the constant potential. Accordingly, it is possible to reduce the variation in the potential of the source lines, caused by the variation in the potential of part or all of the shielding electrodes.

The electrodes or lines having the constant potential include, for example, the common electrode provided on the substrate, lines for supplying the common potential to the common electrode, auxiliary capacitance lines, high-potential power lines, low-potential power lines, and dedicated ground lines for grounding the shielding electrodes. The potentials of the electrodes or lines to which part or all of the shielding electrodes are connected are more preferably the ground potential or near the ground potential.

In the active matrix substrates (60 to 63) according to a ninth aspect of the present invention, in one aspect of the first to eighth aspects described above, only an insulating layer (a first interlayer insulating film 14, a second interlayer insulating film 16, or a third interlayer insulating film 18) may be sandwiched between the shielding electrodes (at least one of the gate detour portions 21, the expanded portions 22, and the separated portions 24 functioning as the lower shielding electrodes 23 and/or the upper shielding electrode 51) and the corresponding source detour portions (31).

With the above configuration, only the insulating layer is sandwiched between the shielding electrodes and the corresponding source detour portions. Accordingly, since the semiconductor layer is not sandwiched and the coupling capacitance between the shielding electrodes and the corresponding source detour portions is not varied, the shielding electrodes are capable of stably shielding the electric field of the source detour portions.

In addition, since another conductive layer is not sandwiched, the shielding electrodes are formed of the conductive layer closest to the corresponding source detour portions, among the conductive layers at the side at which the shielding electrodes are laminated with respect to the gate lines. Accordingly, since the distance between the shielding electrodes and the corresponding source detour portions is short and the coupling capacitance between the shielding electrodes and the corresponding source detour portions is large, the shielding electrodes are capable of effectively shielding the electric field of the source detour portions.

In the active matrix substrates (60 to 63) according to a tenth aspect of the present invention, in one aspect of the first to ninth aspects described above, the width of the shielding electrodes (at least one of the gate detour portions 21, the expanded portions 22, and the separated portions 24 functioning as the lower shielding electrodes 23 and/or the upper shielding electrode 51) may be greater than the width of the corresponding source detour portions (31).

With the above configuration, the width of the shielding electrodes is greater than the width of the corresponding source detour portions. Accordingly, the shielding electrodes are capable of effectively shielding the electric field of the corresponding source detour portions.

In the active matrix substrate according to an eleventh aspect of the present invention, in one aspect of the first to tenth aspects described above, the shielding electrodes (at least one of the gate detour portions 21, the expanded portions 22, and the separated portions 24 functioning as the lower shielding electrodes 23 and/or the upper shielding electrode 51) may be provided along the corresponding source detour portions (31).

With the above configuration, since the shielding electrodes are provided along the corresponding source detour portions, the shielding electrodes are capable of being overlapped with most part of the source detour portions. Accordingly, the shielding electrodes are capable of effectively shielding the electric field of the corresponding source detour portions.

A display device (a liquid crystal display panel 70) according to a twelfth aspect of the present invention may include any of the active matrix substrates (60 to 63) in one aspect of the first to eleventh aspects described above.

A method of manufacturing the active matrix substrates (60 to 63) according to a thirteenth aspect of the present invention includes a first step of setting an opening area (A1), an inner non-display area (A2) at an outer side of the opening area, and a display area (A3) at the outer side of the inner non-display area on an insulating substrate (1); a second step of extending multiple gate lines (20) on the substrate so as to detour the opening area; a third step of extending multiple source lines (30) intersecting with the gate lines on the substrate so as to detour the opening area; and a fourth step of providing multiple pixel electrodes (50) in the display area on the substrate so as to correspond to intersections between the gate lines and the source lines only in the display area. Part of the source lines includes source detour portions (31) passing through the inner non-display area. The method further includes a fifth step of providing shielding electrodes (at least one of the gate detour portions 21, the expanded portions 22, and the separated portions 24 functioning as the lower shielding electrodes 23 and/or the upper shielding electrode 51) in the inner non-display area on the substrate so as to be overlapped with part or all of the source detour portions in a plan view.

With the above manufacturing method, the gate lines and the source lines extend so as to detour the opening area. Accordingly, an opening is capable of being formed in the opening area without damaging the gate lines and the source lines.

With the above manufacturing method, since the shielding electrodes are provided so as to be overlapped with part or all of the source detour portions, the shielding electrodes shield the electric field of the corresponding source detour portions. Accordingly, the shielding electrodes are capable of reducing the parasitic capacitance between the corresponding source detour portions and the source detour portions adjacent to the corresponding source detour portions.

Due to the reduction in the parasitic capacitance, since the amount of variation in the potential of the source lines, caused by the driving of the adjacent source lines in the inner non-display area, is capable of being reduced, the influence on a displayed image is capable of being reduced. Accordingly, it is possible to reduce a reduction in the display quality in the portions corresponding to the source lines including the source detour portions in the display area. Alternatively, since the wiring space of the source detour portions is capable of being reduced by decreasing the adjacent interval between the source detour portions while keeping the display quality in the portions corresponding to the source lines including the source detour portions in the display area, it is possible to reduce the size of the inner non-display area.

The present invention is not limited to the respective embodiments described above and various modifications are available within the range indicated in the claims. Embodiments resulting from arbitrary combination of the technical means disclosed in different embodiments are also included in the technical range of the present invention. In addition, combination of the technical means disclosed in the respective embodiments enables new technical features to be formed.

REFERENCE SIGNS LIST 1 insulating substrate (substrate)
10 buffer layer
11 semiconductor layer
12 gate insulating film (insulating layer)
13 gate layer (first conductive layer)
14 first interlayer insulating film (insulating layer)
15 source layer (second conductive layer)
16 second interlayer insulating film (insulating layer)
17 first transparent conductive layer (fourth conductive layer)
18 third interlayer insulating film (insulating layer)
19 second transparent conductive layer (third conductive layer)
20 gate line
21 gate detour portion (shielding electrode, lower shielding electrode)
22 expanded portion (shielding electrode, lower shielding electrode)
23 lower shielding electrode (shielding electrode)
24 separated portion (shielding electrode, lower shielding electrode)
30 source line
31 source detour portion
40 pixel transistor
41 gate electrode of pixel transistor
42 source electrode of pixel transistor
43 drain electrode of pixel transistor
44 channel of pixel transistor
50 pixel electrode
51 upper shielding electrode
60, 61, 62, 63 active matrix substrate
64 opening
70 display panel
71 opposing substrate
72 liquid crystal layer
73 sealing material
74 gate driver
75 source driver
76 control circuit
80 wristwatch
81 hour hand
82 minute hand
83 second hand
84 drive shaft
85 inner rim
86 outer cover
A1 opening area
A2 inner non-display area
A3 display area
A4 outer non-display area
A5 cut-out area

The invention claimed is:

1. An active matrix substrate comprising:
a substrate on which an opening area, an inner non-display area at an outer side of the opening area, and a display area at an outer side of the inner non-display area are set;
a plurality of gate lines and a plurality of source lines intersecting with the plurality of gate lines arranged in an array, at least two of the plurality of gate lines including a gate arc-shaped portion that bypasses the opening area on opposite row sides and at least two of the plurality of source lines including a source arc-shaped portion that bypasses the opening area on opposite column sides;
a plurality of pixel electrodes provided in the display area on the substrate and surrounded by the plurality of gate lines and the plurality of source lines only in the display area; and
a shielding electrode provided in the inner non-display area on the substrate and overlapped with the source arc-shaped portion in a plan view, wherein:
a substantially circular shape in the plan view is formed by two of the gate arc-shaped portions and two of the source arc-shaped portions, the substantially circular shape being aligned along an outline of the opening area in the plan view, and
in the non-display area, the gate arc-shaped portion and the source arc-shaped portion are crossing each other at an angle not equal to a right angle.

2. The active matrix substrate according to claim 1, wherein the shielding electrode is provided closer to the substrate side than the overlapping source arc-shaped portion.

3. The active matrix substrate according to claim 2, wherein a first conductive layer comprising the plurality of gate lines formed thereon is provided and laminated closer to the substrate side than a second conductive layer comprising the plurality of source lines formed thereon, and
wherein the shielding electrode is formed of the first conductive layer.

4. The active matrix substrate according to claim 3, wherein the shielding electrode is connected to the gate arc-shaped portion.

5. The active matrix substrate according to claim 1, wherein the shielding electrode is provided at a side of the substrate farther than the overlapping source arc-shaped portion from the substrate.

6. The active matrix substrate according to claim 5, wherein a third conductive layer comprising the pixel electrodes is provided and laminated at a side of the substrate farther than the second conductive layer from the substrate, wherein
the plurality of source lines is formed on the second conductive layer, and
the shielding electrode is formed of the third conductive layer.

7. The active matrix substrate according to claim 5, further comprising:
a common electrode, wherein a fourth conductive layer comprising the common electrode is provided and laminated at a side of the substrate farther than the second conductive layer from the substrate, wherein the plurality of source lines is formed on the second conductive layer, and the shielding electrode is formed of the fourth conductive layer.

8. The active matrix substrate according to claim 1, wherein the shielding electrode is connected to electrodes or lines having constant potential.

9. The active matrix substrate according to claim 1, wherein only an insulating layer is sandwiched between the shielding electrode and the overlapping source arc-shaped portion.

10. The active matrix substrate according to claim 1, wherein a width of the shielding electrode is greater than a width of the overlapping source arc-shaped portion.

11. The active matrix substrate according to claim 1, wherein the shielding electrode is provided along the overlapping source arc-shaped portion.

12. A display device comprising the active matrix substrate according to claim 1.

13. A method of manufacturing an active matrix substrate, the method comprising:

setting an opening area, an inner non-display area at an outer side of the opening area, and a display area at an outer side of the inner non-display area on a substrate;

providing a plurality of gate lines and source lines on the substrate, the gate lines intersecting with the source lines forming in an array; at least two of the plurality of gate lines including a gate arc-shaped portion that bypasses the opening area on opposite row sides; at least two of the plurality of source lines including a source arc-shaped portion that bypasses the opening area on opposite column sides;

providing a plurality of pixel electrodes in the display area on the substrate and surrounded by the plurality of gate lines and the plurality of source lines only in the display area;

providing a shielding electrode in the inner non-display area on the substrate and overlapped with the source arc-shaped portion in a plan view; and forming a substantially circular shape aligned along an outline of the opening area in the plan view that is formed by two of the gate arc-shaped portions and two of the source arc-shaped portions, wherein in the non-display area, the gate arc-shaped portion and the source arc-shaped portion are crossing each other at an angle not equal to a right angle.

* * * * *